United States Patent
Geiger et al.

(10) Patent No.: US 11,029,176 B2
(45) Date of Patent: Jun. 8, 2021

(54) SYSTEM AND METHOD FOR VIBRATION DETECTION WITH NO LOSS OF POSITION INFORMATION USING A MAGNETIC FIELD SENSOR

(71) Applicant: Allegro MicroSystems, LLC, Manchester, NH (US)

(72) Inventors: Benjamin Geiger, Auburn, NH (US); Cédric Gillet, Annecy (FR)

(73) Assignee: Allegro MicroSystems, LLC, Manchester, NH (US)

( * ) Notice: Subject to any disclaimer, the term of this patent is extended or adjusted under 35 U.S.C. 154(b) by 297 days.

(21) Appl. No.: 16/404,981

(22) Filed: May 7, 2019

(65) Prior Publication Data

US 2020/0355522 A1    Nov. 12, 2020

(51) Int. Cl.
| | |
|---|---|
| *G01D 5/14* | (2006.01) |
| *G01D 5/244* | (2006.01) |
| *G01P 3/487* | (2006.01) |
| *G01P 3/489* | (2006.01) |
| *G01R 33/07* | (2006.01) |
| *G01R 33/09* | (2006.01) |

(52) U.S. Cl.
CPC ......... *G01D 5/24452* (2013.01); *G01D 5/147* (2013.01); *G01D 5/2448* (2013.01); *G01D 5/2449* (2013.01); *G01P 3/487* (2013.01); *G01P 3/489* (2013.01); *G01R 33/07* (2013.01); *G01R 33/09* (2013.01)

(58) Field of Classification Search
CPC ..... G01D 5/24452; G01D 5/147; G01P 3/487
See application file for complete search history.

(56) References Cited

U.S. PATENT DOCUMENTS

| | | |
|---|---|---|
| 3,304,434 A | 2/1967 | Koster |
| 4,185,265 A | 1/1980 | Griffin et al. |
| 4,225,939 A | 9/1980 | Yashiro |
| 4,283,679 A | 8/1981 | Ito et al. |
| 4,293,814 A | 10/1981 | Boyer |
| 4,367,721 A | 1/1983 | Boyer |
| 4,374,333 A | 2/1983 | Avery |

(Continued)

FOREIGN PATENT DOCUMENTS

| | | |
|---|---|---|
| DE | 3815530 | 11/1989 |
| DE | 19650935 | 6/1998 |

(Continued)

OTHER PUBLICATIONS

U.S. Appl. No. 16/404,960, filed May 7, 2019, Geiger et al.
(Continued)

*Primary Examiner* — Reena Aurora
(74) *Attorney, Agent, or Firm* — Daly, Crowley, Mofford & Durkee, LLP

(57) ABSTRACT

A method of detecting a vibration comprises determining a vibration flag has been set during a running mode, entering a vibration mode, providing direction information for a target object during the vibration mode of the magnetic field sensor, holding onto positive peak values and negative peak values of the magnetic field signal during the vibration mode of the magnetic field sensor, and returning to the running mode after receiving at least two clock cycles of the magnetic field signal with no further vibration flags set.

18 Claims, 21 Drawing Sheets

(56) References Cited

U.S. PATENT DOCUMENTS

| | | |
|---|---|---|
| 4,443,716 A | 4/1984 | Avery |
| 4,476,901 A | 10/1984 | Sainen |
| 4,513,403 A | 4/1985 | Troy |
| 4,642,555 A | 2/1987 | Swartz et al. |
| 4,649,796 A | 3/1987 | Schmidt |
| 4,705,964 A | 11/1987 | Higgs |
| 4,893,027 A | 1/1990 | Kammerer et al. |
| 4,906,928 A | 3/1990 | Gard |
| 4,992,731 A | 2/1991 | Lorenzen |
| 5,099,197 A | 3/1992 | Hauck et al. |
| 5,291,133 A | 3/1994 | Gokhale et al. |
| 5,317,258 A | 5/1994 | Setzer et al. |
| 5,332,956 A | 7/1994 | Oh |
| 5,442,283 A | 8/1995 | Vig et al. |
| 5,451,946 A | 9/1995 | Smith et al. |
| 5,459,398 A | 10/1995 | Hansen et al. |
| 5,477,142 A | 12/1995 | Good et al. |
| 5,486,759 A | 1/1996 | Seiler et al. |
| 5,493,219 A | 2/1996 | Makino et al. |
| 5,497,084 A | 3/1996 | Bicking |
| 5,510,706 A | 4/1996 | Good |
| 5,650,719 A | 7/1997 | Moody et al. |
| 5,694,038 A | 12/1997 | Moody et al. |
| 5,696,790 A | 12/1997 | Graham et al. |
| 5,729,130 A | 3/1998 | Moody et al. |
| 5,781,005 A | 7/1998 | Vig et al. |
| 5,801,655 A | 9/1998 | Imamura |
| 5,917,320 A | 6/1999 | Scheller et al. |
| 6,091,239 A | 7/2000 | Vig et al. |
| 6,100,680 A | 8/2000 | Vig et al. |
| 6,232,768 B1 | 5/2001 | Moody et al. |
| 6,242,904 B1 | 6/2001 | Shirai et al. |
| 6,242,905 B1 | 6/2001 | Draxelmayr |
| 6,242,908 B1 | 6/2001 | Scheller et al. |
| 6,279,248 B1 | 9/2001 | Walters |
| 6,297,627 B1 | 10/2001 | Towne et al. |
| 6,297,681 B1 | 10/2001 | Wang |
| 6,317,067 B1 | 11/2001 | Mohindra |
| 6,492,804 B2 | 12/2002 | Tsuge et al. |
| 6,525,531 B2 | 2/2003 | Forrest et al. |
| 6,653,968 B1 | 11/2003 | Schneider |
| 6,693,419 B2 | 2/2004 | Stauth et al. |
| 6,795,007 B2 | 9/2004 | Mayes |
| 6,815,944 B2 | 11/2004 | Vig et al. |
| 6,967,476 B2 | 11/2005 | Block et al. |
| 7,013,233 B2 | 3/2006 | Block et al. |
| 7,026,808 B2 | 4/2006 | Vig et al. |
| 7,095,255 B2 | 8/2006 | Schuelein |
| 7,138,793 B1 | 11/2006 | Bailey |
| 7,141,964 B2 | 11/2006 | Hoffman et al. |
| 7,184,876 B2 | 2/2007 | Teulings et al. |
| 7,199,579 B2 | 4/2007 | Scheller et al. |
| 7,253,614 B2 | 8/2007 | Forrest et al. |
| 7,295,000 B2 | 11/2007 | Werth |
| 7,365,530 B2 | 4/2008 | Bailey et al. |
| 7,368,904 B2 | 5/2008 | Scheller et al. |
| 7,592,801 B2 | 9/2009 | Bailey et al. |
| 7,622,914 B2 | 11/2009 | Bailey et al. |
| 7,772,838 B2 | 8/2010 | Bailey et al. |
| 8,164,324 B2 | 4/2012 | Hara et al. |
| 8,446,146 B2 | 5/2013 | Foletto et al. |
| 8,450,996 B2 | 5/2013 | Foletto et al. |
| 8,624,588 B2 | 1/2014 | Vig et al. |
| 8,680,848 B2 * | 3/2014 | Foletto ............... G01D 5/14 324/207.25 |
| 9,170,128 B2 | 10/2015 | Foletto et al. |
| 9,329,057 B2 | 5/2016 | Foletto et al. |
| 9,778,326 B2 * | 10/2017 | Chen ............... G01D 5/2448 |
| 2001/0002791 A1 | 6/2001 | Tsuge et al. |
| 2004/0062362 A1 | 4/2004 | Matsuya |
| 2005/0225318 A1 | 10/2005 | Bailey et al. |
| 2005/0225319 A1 | 10/2005 | Bailey et al. |
| 2007/0132450 A1 | 6/2007 | Scheller et al. |
| 2008/0164871 A1 | 7/2008 | Bailey et al. |
| 2020/0080867 A1 * | 3/2020 | Foletto ............... G01D 5/2448 |

FOREIGN PATENT DOCUMENTS

| | | |
|---|---|---|
| DE | 19717364 | 8/1998 |
| DE | 19960504 | 8/2001 |
| WO | WO 96/23198 | 8/1996 |
| WO | WO 03/069358 | 8/2003 |
| WO | WO 03/098229 | 11/2003 |
| WO | WO 03/098230 | 11/2003 |
| WO | WO 03/100352 | 12/2003 |

OTHER PUBLICATIONS

Partial International Search Report for PCT/US2003/002489 issued for the PCT application; form PCT/ISA206; dated Oct. 2, 2003; 3 pages.

PCT Search Report and Written Opinion of the ISA for PCT/US2003/002489 dated Nov. 19, 2003; 9 pages.

PCT Search Report and Written Opinion of the ISA for PCT/US2006/007824 dated Jul. 7, 2006; 11 pages.

Infineon Technologies; "Differential Two-Wire Hall Effect Sensor IC;" TLE4942 Preliminary Data Sheet; Jun. 2000; 13 pages.

Infineon Technologies; "Differential Two-Wire Hall Effect Sensor IC;" TLE4953C Preliminary Data Sheet; Jun. 2000; 15 pages.

Robert Bosch GMBH Stuttgart; "Active Sensor for ABS/ASR/VED-Systems with 2-Wire Current Interface;" Specification TLE4941/TLE4942; Version 5, Jul. 25, 2000; 44 pages.

Allegro MicroSystems, LLC datasheet A1693 "Vibration-Tolerant Hall-Effect Transmission Speed and Direction Sensor IC", Apr. 24, 2019, 15 pages.

Allegro MicroSystems, LLC datasheet ATS651LSH "Two-Wire Self-Calibrating Differential Speed and Direction Sensor IC with Vibration Immunity", Dec. 5, 2016, 14 pages.

Allegro MicroSystems, LLC datasheet ATS693LSG Three-Wire, Differential, Vibration Resistant Sensor IC with Speed and Direction Output, Apr. 30, 2019, 15 pages.

Image File Wrapper downloaded on Apr. 1, 2009; for U.S. Pat. No. 7,365,530 filed on Sep. 16, 2004; Part 1 of 4; 244 pages.

Image File Wrapper downloaded on Apr. 1, 2009; for U.S. Pat. No. 7,365,530 filed on Sep. 16, 2004; Part 2 of 4; 189 pages.

U.S. Pat. No. 7,365,530 filed on Sep. 16, 2004.

U.S. Pat. App. No. 10/820,957 filed on Apr. 8, 2004.

Office Action dated Oct. 30, 2008 for U.S. Appl. No. 12/053,004; 5 pages.

Response to Office Action dated Dec. 16, 2008 for U.S. Appl. No. 12/053,004; 10 pages.

Final Office Action dated Mar. 24, 2009 for U.S. Appl. No. 12/053,004; 6 pages.

Response to Final Office Action dated Apr. 27, 2009 for U.S. Appl. No. 12/053,004; 12 pages.

Notice of Allowance dated May 22, 2009 for U.S. Appl. No. 12/053,004; 7 pages.

Office Action dated May 14, 2009 for U.S. Appl. No. 12/337,972; 5 pages.

Response to Office Action dated Jun. 9, 2009 for U.S. Appl. No. 12/337,972; 8 pages.

Notice of Allowance dated Aug. 11, 2009 for U.S. Appl. No. 12/337,972; 4 pages.

Notice of Allowance dated Mar. 9, 2010 for U.S. Appl. No. 12/338,048; 7 pages.

Office Action dated Apr. 13, 2021 for U.S. Appl. No. 16/404,960, 12 pages.

* cited by examiner

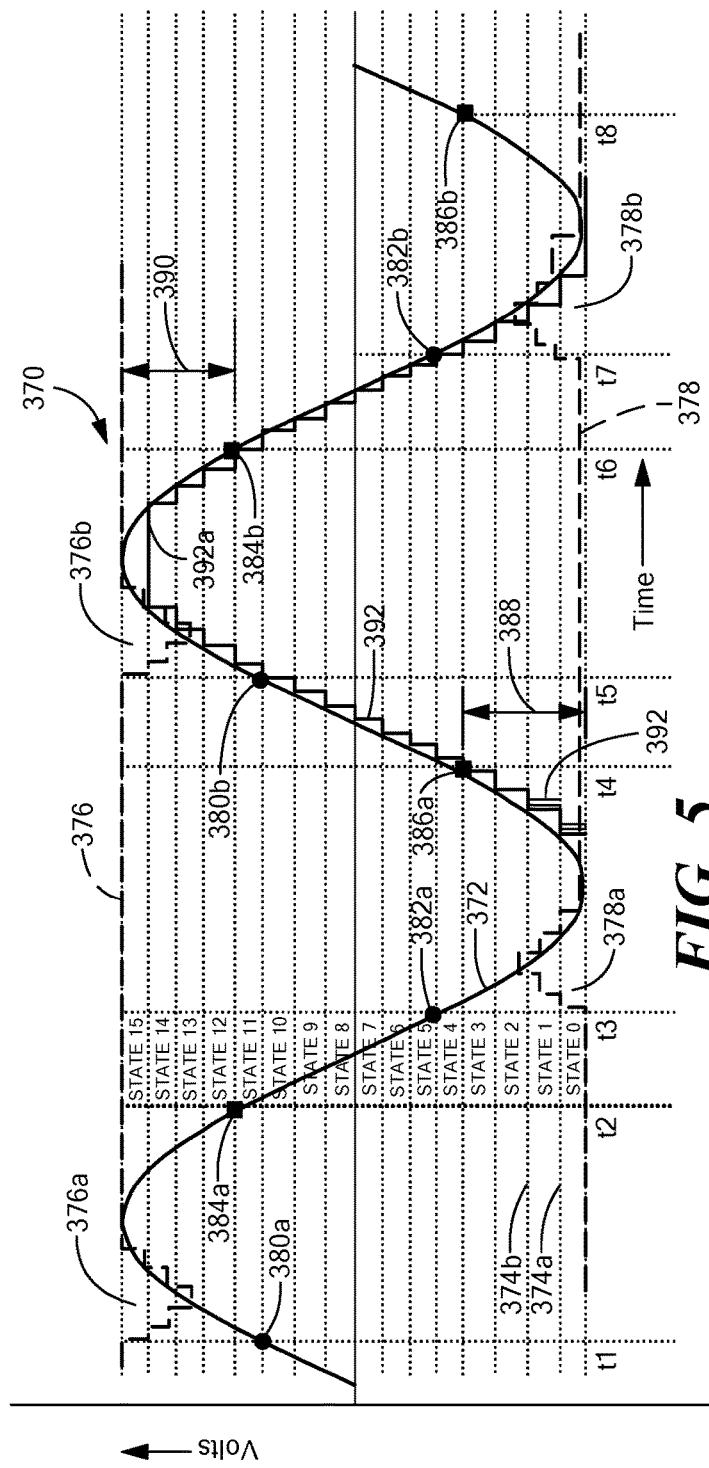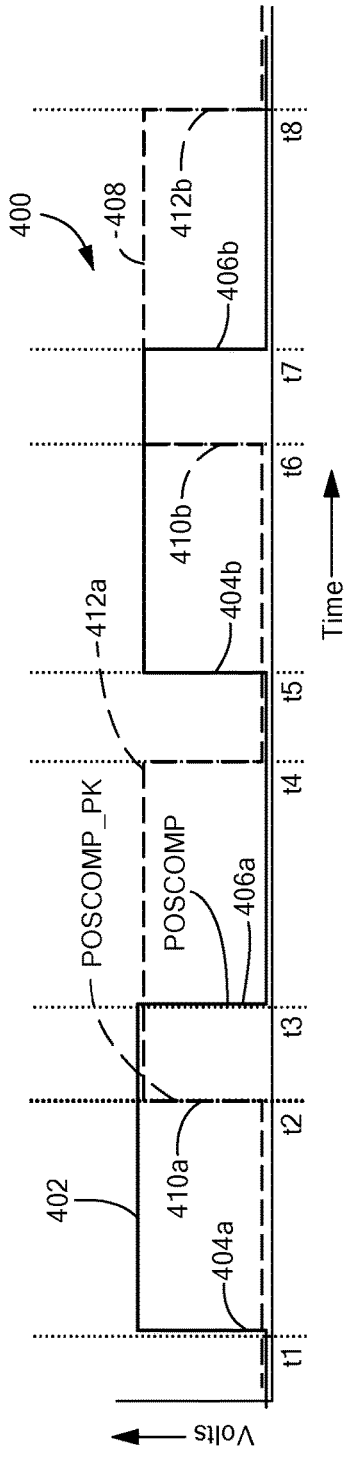
FIG. 5
FIG. 5A

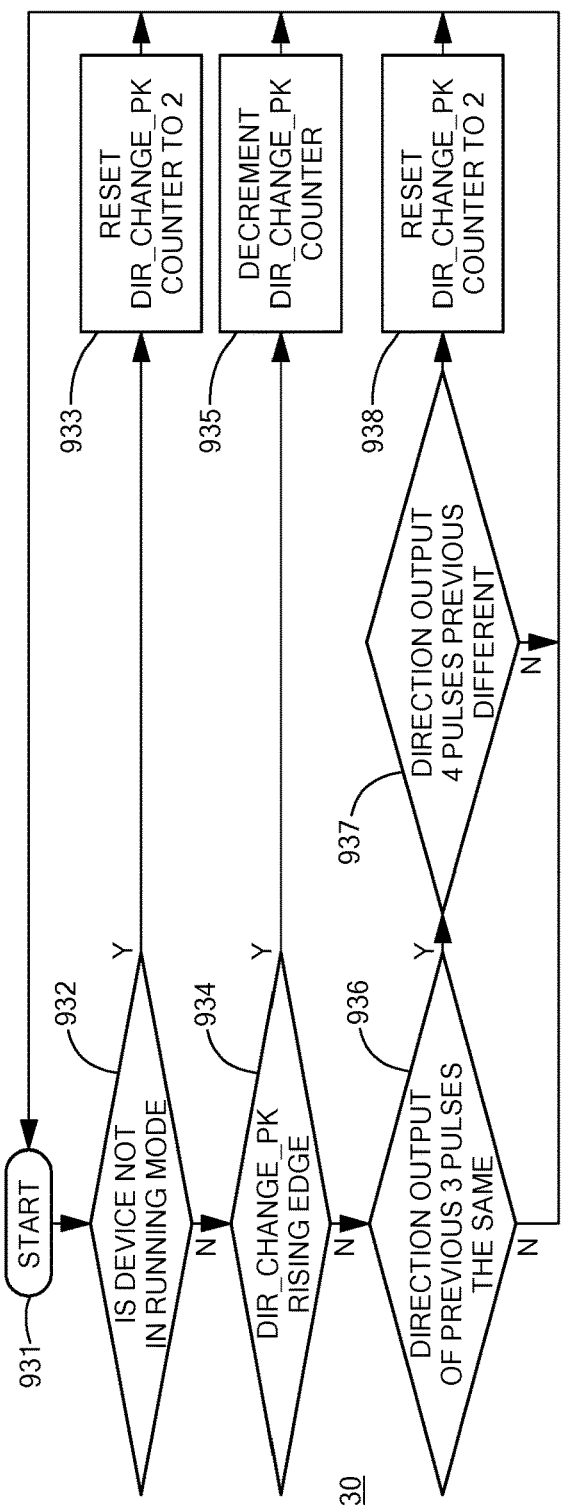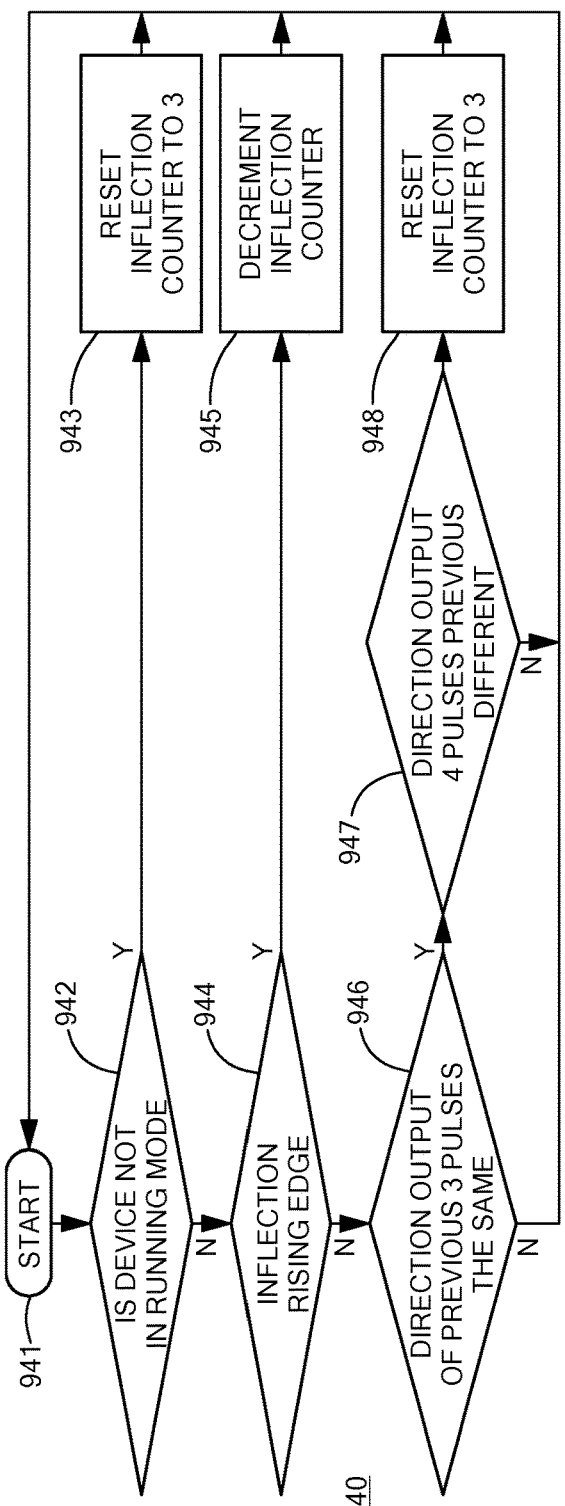
FIG. 9C 930
FIG. 9D 940

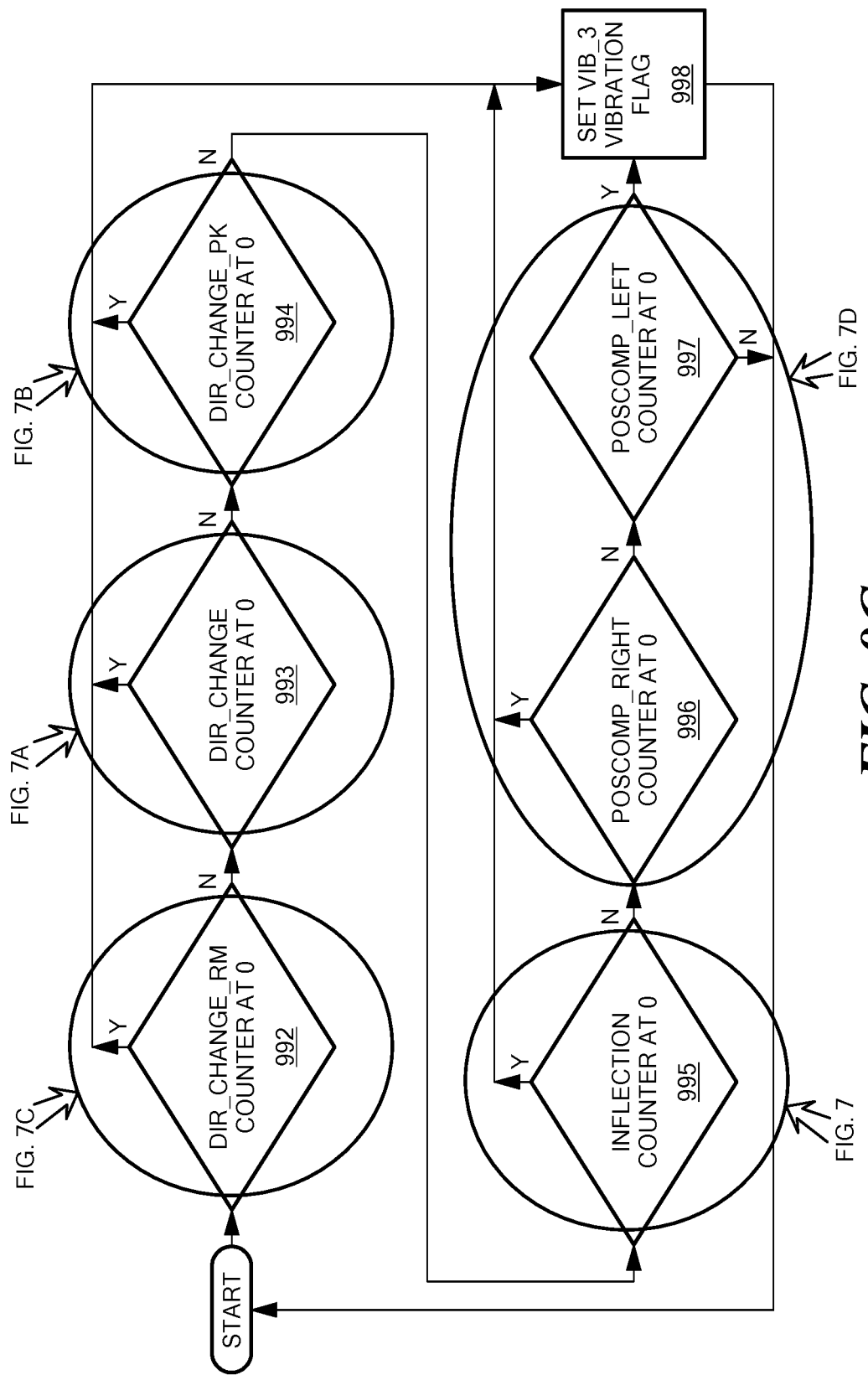

SYSTEM AND METHOD FOR VIBRATION DETECTION WITH NO LOSS OF POSITION INFORMATION USING A MAGNETIC FIELD SENSOR

CROSS REFERENCE TO RELATED APPLICATIONS

Not Applicable.

STATEMENT REGARDING FEDERALLY SPONSORED RESEARCH

Not Applicable.

FIELD

The present disclosure relates generally to systems and method for detecting a vibration of a target object using a magnetic field sensor.

BACKGROUND

As is known, sensors are used to perform various functions in a variety of applications. Some sensors include one or more magnetic field sensing elements, such as a Hall effect element or a magnetoresistive element, to sense a magnetic field associated with proximity or motion of a target object, such as a ferromagnetic object in the form of a gear or ring magnet.

The magnetic field sensor processes the magnetic field signal to generate an output signal that, in some arrangements, changes states each time the magnetic field signal crosses thresholds, either near to peaks (positive and/or negative peaks) or near to some other level, for example, zero-crossings of the magnetic field signal. Therefore, the output signal has an edge rate or period indicative of a speed of rotation of the ferromagnetic (e.g., ferrous) or magnetic object, for example, a gear or ring magnet (either of which may or may not be ferrous) or other target object.

One application for a magnetic field sensor is to detect the approach and retreat of each tooth of a rotating ferromagnetic gear, either a hard magnetic gear or a soft ferromagnetic gear. In some particular arrangements, a ring magnet having magnetic regions (permanent or hard magnetic material) with alternating polarity is coupled to the ferromagnetic gear or is used by itself and the magnetic field sensor is responsive to the approach and retreat of the magnetic regions of the ring magnet. In other arrangements, a gear is disposed proximate to a stationary magnet and the magnetic field sensor is responsive to perturbations of a magnetic field as the gear rotates. Such arrangements are also referred to as proximity sensors or motion sensors. In the case of sensed rotation, the arrangements can be referred to as rotation sensors. As used herein, the terms "detector" and "sensor" are used to mean substantially the same thing.

SUMMARY

According to the present disclosure, a method of detecting a vibration of a target object with a magnetic field sensor includes generating one or more detector output signals having state transitions at times determined by applying a threshold to a magnetic field signal generated by one or more magnetic field sensing elements of the magnetic field sensor in response to a magnetic field affected by the target object, determining a vibration flag indicative of a vibration of the target object has been set during a running mode of the magnetic field sensor, entering a vibration mode of the magnetic field sensor when the vibration flag has been set, holding positive peak values and negative peak values of the magnetic field signal during the vibration mode of the magnetic field sensor, providing direction information for the target object during the vibration mode of the magnetic field sensor based on the one or more detector output signals, and returning to a running mode of the magnetic field sensor after a predetermined number of state transitions of the one or more detector output signals with no further vibration flags set.

Features may include one more of the following individually or in combination with other features. In the method, wherein holding the positive peak values and the negative peak values can include allowing outward updating of the positive peak values and the negative peak values while restricting inward updating of the positive peak values and the negative peak values during the vibration mode. The vibration flag includes at least one of: an inflection flag, a peak in flag, a peak clamp flag, a phase too close flag, a direction change flag, a direction change peak flag, or a direction change running mode (rm) flag. An edge counter can be incremented after each state transition of the one or more detector output signals. The positive peak values can update on a rising edge of the state transitions of the one or more detector output signals. The negative peak values can update on a falling edge of the state transitions of the one or more detector output signals. The determined vibration flag includes a first vibration flag and wherein the edge counter is reset to zero if a second vibration flag indicative of a vibration of the target object is set. The threshold can be based on the positive peak values and negative peak values.

Also described is a method of detecting a vibration of a target object with a magnetic field sensor, including generating one or more detector output signals having state transitions at times determined by applying a threshold to a magnetic field signal generated by one or more magnetic field sensing elements of the magnetic field sensor in response to a magnetic field affected by the target object, determining a vibration flag indicative of a vibration of the target object has been set during a running mode of a magnetic field sensor, entering a vibration mode in response to the vibration flag determination, wherein the vibration mode comprises providing direction information for the target object, and returning to the running mode of the magnetic field sensor after a predetermined number of state transitions of the one or more detector output signals with no vibration flags set.

Features may include one more of the following individually or in combination with other features. The vibration mode includes holding positive peak values and negative peak values of the magnetic field signal. The vibration mode further includes allowing inward updating of the positive peak values and the negative peak values while restricting outward updating of the positive and negative peak values. The vibration flag includes at least one of: an inflection flag, a peak in flag, a peak clamp flag, a phase too close flag, a direction change flag, a direction change peak flag, or a direction change running mode (rm) flag. An edge counter can be incremented after each state transition of the one or more detector output signals. The positive peak values can update on the rising edge of the state transitions of the one or more detector output signals and the negative peak values can update on the falling edge of the state transitions of the one or more detector output signals.

Also described is a method of detecting vibration of a target object with a magnetic field sensor, including generating one or more detector output signals having state transitions at times determined by applying a threshold to a magnetic field signal generated by one or more magnetic field sensing elements of the magnetic field sensor in response to a magnetic field affected by the target object, providing direction information for the target object during a vibration mode of a magnetic field sensor based on the one or more detector output signals, allowing outward updating of positive peak values and negative peak values of the magnetic field signal during the vibration mode while restricting inward updating of the positive peak values and the negative peak values, and generating the threshold based on the positive peak values and the negative peak values of the magnetic field signal.

Features may include one more of the following individually or in combination with other features. The method can include entering the vibration mode based on a determination that a vibration flag indicative of a vibration of the target object has been set, wherein the vibration flag comprises at least one of: an inflection flag, a peak in flag, a peak clamp flag, a phase too close flag, a direction change flag, a direction change peak flag, or a direction change running mode (rm) flag. An edge counter can be incremented after each state transition of the one or more detector output signals. The positive peak values can update on a rising edge of the state transitions of the one or more detector output signals and the negative peak values can update on a falling edge of the state transitions of the one or more detector output signals.

BRIEF DESCRIPTION

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIG. 5 is a graph showing a DIFF signal (also representative of a digital DIFF signal or a digital IDDIFF signal) and associated states of the motion sensor of FIG. 2;

FIG. 5A is a graph showing POSCOMP and POSCOMP_PK signals derived from the DIFF signal of FIG. 5 by the motion sensor of FIG. 2;

FIGS. 9A-9G are flow charts showing a method for the recalibration mode upon detecting a vibration flag;

DETAILED DESCRIPTION

Before describing the present invention, some introductory concepts and terminology are explained. As used herein, the term "magnetic field sensing element" is used to describe a variety of types of electronic elements that can sense a magnetic field. The magnetic field sensing elements can be, but are not limited to, Hall effect elements, magnetoresistance elements, or magnetotransistors. As is known, there are different types of Hall effect elements, for example, planar Hall elements, vertical Hall elements, circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, many, but not all, types of magnetoresistance elements tend to have axes of maximum sensitivity parallel to the substrate and many, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch or proximity detector that senses the proximity of a ferromagnetic or magnetic object, a rotation detector (rotation sensor or motion sensor) that senses passing ferromagnetic articles, for example, magnetic domains of a ring magnet or teeth of a ferromagnetic gear, and a magnetic field sensor that senses a magnetic field density of a magnetic field. Rotation detectors are used as examples herein. However, the circuits and techniques described herein apply also to any magnetic field sensor capable of detecting a motion of an object, i.e., any motion sensor.

As used herein, the term "rotational vibration" refers to a back and forth rotation of an object about an axis of rotation, which object is adapted to rotate in a unidirectional manner about the axis of rotation in normal operation. As used herein, the term "translational vibration" refers to translation of the object and/or of magnetic field sensors used to detect magnetic fields generated by the object generally in a direction perpendicular to the axis of rotation. It should be recognized that both rotational vibration and translational vibration can cause signals to be generated by the magnetic field sensors.

Figure 1:
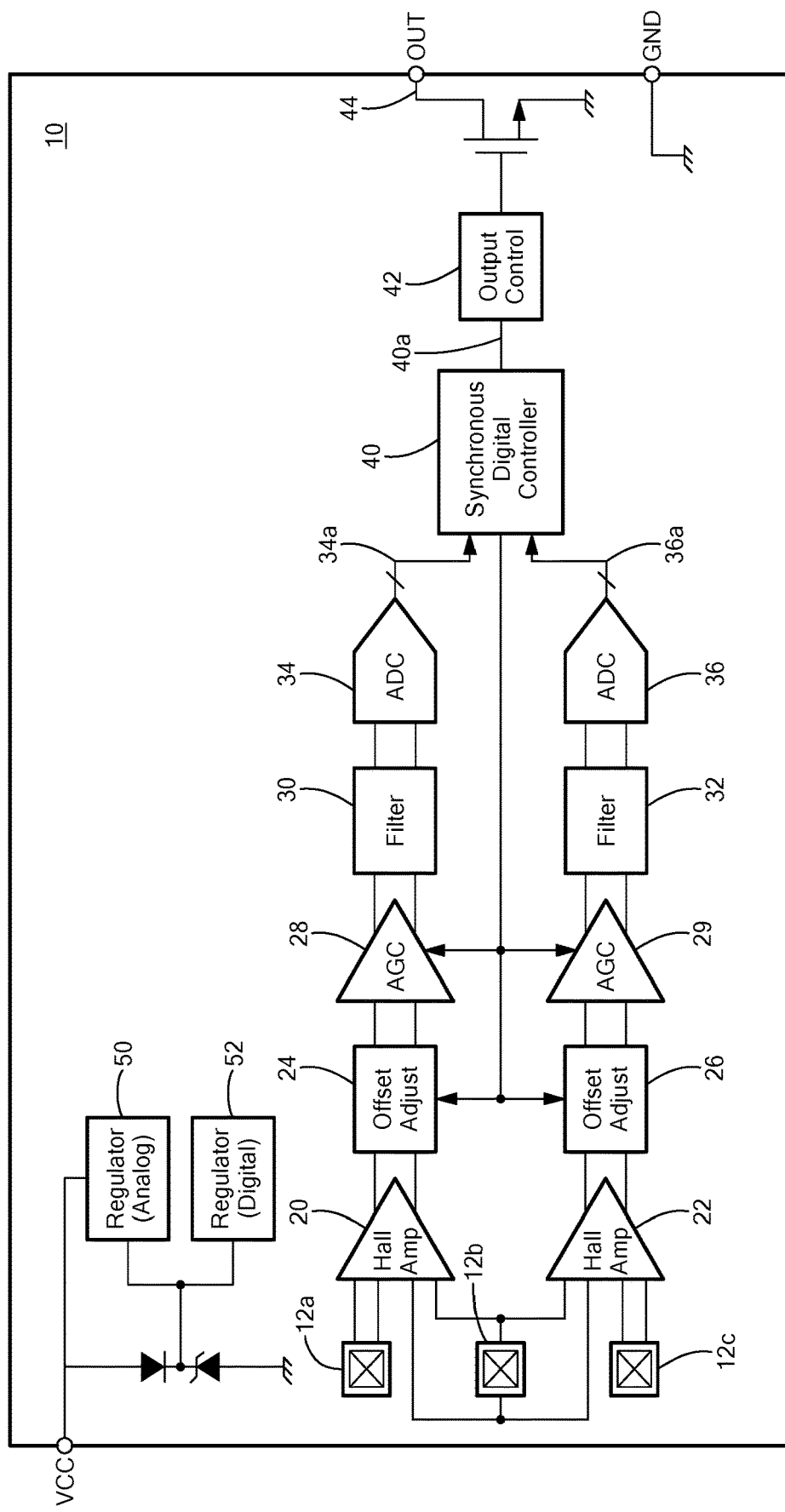
FIG. 1 is a block diagram of a motion sensor, according to the present disclosure.
Figure 2:
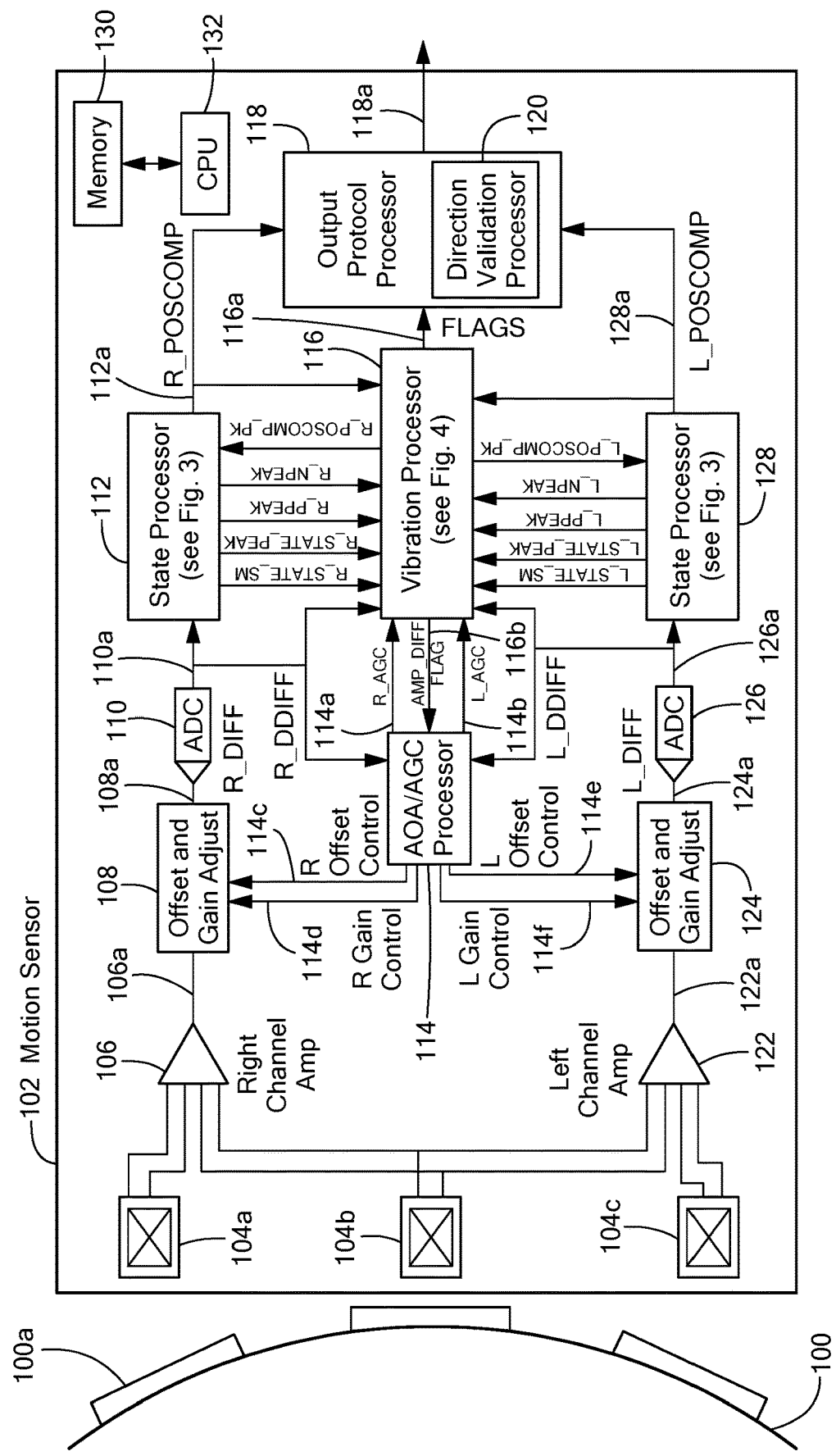
FIG. 2 is a block diagram showing a motion sensor having two state processors, a vibration processor, an automatic offset adjust (AOA) and automatic gain control (AGC) processor, two offset and gain adjust circuits, and an output protocol processor.

Referring to FIG. 1, an exemplary motion sensor 10 includes three magnetic field sensing elements 12a, 12b, 12c, each configured to generate a respective magnetic field signal in response to a passing target, such as passing teeth of a rotating gear (FIG. 2). The motion sensor 10 also includes a right channel amplifier 20 and a left channel amplifier 22. The terms "right" and "left" are arbitrary identifiers, which indicate different physical positions of the magnetic field sensing elements that contribute to a right channel and a left channel.

Motion sensor 10 can include offset and/or gain adjustment circuitry to remove unwanted DC offsets and provide adjustable gain to signals, as may be provided by an offset adjustment circuit 24 for the right channel, an offset adjustment circuit 26 for the left channel, an automatic gain control (AGC) circuit 28 for the right channel, and an AGC circuit 29 for the left channel. Filters, such as right channel filter 30 and left channel filter 32, may also be provided.

Analog-to-digital converters (ADCs) can be provided to generate digital signals for further processing by a digital controller 40. Right channel ADC 34 can generate a right channel digital signal 34a and left channel ADC 36 can generate a left channel digital signal 36a. Analog and digital voltage regulators 50, 52 can be coupled to an input voltage source VCC to generate respective regulated voltages for powering analog and digital circuitry of the sensor 10.

Controller 40 is configured to process the left channel digital signal 34a and the right channel digital signal 36a and couple various signals thus generated 40a to an output control circuit 42. The output control circuit 42 is configured to generate a sensor output signal 44 indicative of a motion of the target (as may include an indication of a direction of motion of the target) and also indicative of a vibration of the target and/or of one or more of the sensing elements 12a-12c. For simplicity, detected vibration is described herein as being vibration of the target.

To this end, controller 40 can include one or more state processors and vibration processors as will be discussed further below in conjunction with motion sensor 102 of FIG. 2. Suffice it to say here that controller 40 generates at least one or more detector output signals having state transitions at times determined by applying a threshold to magnetic field signals generated by one or more of the sensing elements 12a-12c and additionally generates one or more vibration flags indicative of a vibration of the sensor and/or target. Example vibration flags are referenced in connection with FIG. 4 for example and include, but are not limited to an inflection flag, a peak in flag, a peak clamp flag, a phase too close flag, a direction change flag, a direction change peak flag, or a direction change running mode (rm) flag.

Sensor 10 is configured to have various modes of operation as may include a calibration mode, a running mode, a vibration mode, and/or recalibration mode. Calibration can refer to an operational mode in which the threshold level is determined and/or in which the positive and negative peaks of the magnetic field signals are acquired and/or in which threshold levels are determined. Calibration can occur at a time near start up or power up of the sensor and recalibration can refer to a mode of operation in which similar functions are performed, but which may be entered after initial startup of the sensor and in response to certain conditions as will be explained. The vibration mode of operation can be an operational mode entered when a vibration is detected and running mode can refer to all other operational times.

According to an aspect of the disclosure, during the running mode of operation, it can be determined if a vibration flag has been set. If a vibration flag is determined to have been set during the running mode, the vibration mode can be entered in which direction information for the target object can continue to be provided. The sensor can return to the running mode after a predetermined number of state transitions of the detector output signals with no vibration flags set. With this arrangement, when a vibration is detected, the target position information (e.g., direction of rotation) can continue to be provided by the sensor. This can be contrasted to some conventional vibration detection schemes in which the target position information is not provided during a vibration event.

According to a further aspect, during the running mode of operation, it can be determined if a vibration flag has been set. The sensor can remain in the running mode until a determination is made that a predetermined number of vibration flags have been set and a recalibration mode can be entered when the predetermined number of vibration flags have been set.

Referring to FIG. 2, an exemplary motion sensor 102 includes three magnetic field sensing elements 104a-104c, each configured to generate a respective magnetic-field-sensing-element signal in response to passing teeth of a rotating gear 100, in particular teeth of the rotating gear 100, of which a tooth 100a is but one example. The motion sensor 102 also includes a right channel amplifier 106 and a left channel amplifier 122.

The motion sensor 102 can include offset and gain adjustment circuits 108, 124 that remove unwanted DC offsets and provide adjustable gains to signals 106a, 122a provided by the amplifiers 106, 122, respectively. The offset and gain adjustment circuits 108, 124 generate an R_DIFF signal 108a and an L_DIFF signal 124a, respectively. In some alternate embodiments, the motion sensor 102 includes only offset or only gain adjustment circuits.

The offset and gain adjustment circuits 108, 124 are not described in detail herein. However, the offset and gain adjustment circuits 108, 124 can be of a type described in U.S. Pat. No. 7,138,793, issued Nov. 21, 2006, which is assigned to the assignee of the present invention.

The R_DIFF signal 108a and an L_DIFF signal 124a are referred to herein as magnetic field signals, responsive to magnetic fields sensed by the magnetic field sensing elements 104a-104c. The R_DIFF signal 108a is representative of a magnetic field experienced by the magnetic field sensing elements 104a, 104b and the L_DIFF signal 124a is representative of a magnetic field experienced by the magnetic field sensing elements 104b, 104c.

The motion sensor 102 can include an analog-to-digital converter (ADC) 110 coupled to receive the R_DIFF signal 108a and configured to generate a right channel digital DIFF signal, R_DDIFF, 110a. Another analog-to-digital converter (ADC) 126 is coupled to receive the L_DIFF signal 124a and configured to generate a left channel digital DIFF signal, L_DDIFF, 126a. The R_DDIFF signal 110a and the L_DDIFF signal 126a are also referred to herein as magnetic field signals.

The motion sensor 102 can include a first state processor 112 coupled to receive the R_DDIFF signal 110a and configured to generate a plurality of signals including a right channel state signal, R_STATE_SM, indicative of a plurality of states associated with the R_DDIFF signal 110a, where each state is indicative of a range of signal values into which the R_DDIFF signal 110a falls during a respective time period. The first state processor 112 is also configured to generate an R_POSCOMP signal 112a, which, from discussion below, will be understood to be a two state signal having state transitions according to predetermined states of the R_STATE_SM signal.

Similarly, the motion sensor 102 can include a second state processor 128 coupled to receive the L_DDIFF signal 126a and configured to generate a plurality of signals including a left channel state signal, L_STATE_SM, indicative of a plurality of states associated with the L_DDIFF signal 126a, where each state is indicative of a range of signal values into which the L_DDIFF signal 126a falls during a respective time period. The second state processor 128 is also configured to generate an L_POSCOMP signal 128a, which, from discussion below, will also be understood to be a two state signal having state transitions according to predetermined states of the L_STATE_SM signal.

The state processors 112, 128 are also configured to generate an R_STATE_PEAK signal and an L_STATE_PEAK signal, respectively, which are similar to the R_STATE_SM and L_STATE_SM signals, but with a reduced amount of undesirable chatter between states, as is described further in U.S. Pat. No. 8,446,146, entitled "Motion Sensor, Method, and Computer-Readable Storage Medium Providing a Motion Sensor with a Validated Output Signal from the Motion Sensor" issued on May 21, 2013 and incorporated herein by reference in its entirety.

The state processors 112, 128 are also configured to generate an R_PPEAK signal and an L_PPEAK signal, respectively, which are indicative of magnitudes of positive peaks of the R_DDIFF signal and the L_DDIFF signal, respectively. The state processors 112, 128 are also configured to generate an R_NPEAK signal and an L_NPEAK signal, respectively, which are indicative of magnitudes of negative peaks of the R_DDIFF signal and the L_DDIFF signal, respectively.

The state processors 112, 128 are also configured to generate an R_POSCOMP_PK signal and an L_POSCOMP_PK signal, respectively, which are similar to the R_POSCOMP and L_POSCOMP signals 112a, 128a, but with different timing.

The motion sensor 102 can include a vibration processor 116 coupled to receive the R_POSCOMP signal 112a, the L_POSCOMP signal 128a, the R_STATE_SM signal, the L_STATE_SM signal, the R_STATE_PEAK signal, the L_STATE_PEAK signal, the R_PPEAK signal, the L_PPEAK signal, the R_NPEAK signal, the L_NPEAK signal, the R_POSCOMP_PK signal, and the L_POSCOMP_PK signal. The vibration processor 116 is also coupled to receive an R_AGC signal 114a and a L_AGC signal 114b, representative of values of right and left channel automatic gain controls signals 114d, 114f, respectively.

The vibration processor 116 is configured to generate one or more FLAG signals (binary indicators) 116a and an amplitude difference flag signal (AMP_DIFF_FLAG signal) 116b, each of which can be indicative of a vibration of the object 100, or of no vibration of the object 100.

In some embodiments, the vibration processor 116 can include two or more vibration sub-processors described below, each of which can detect a vibration and each of which can contribute to the FLAG signals 116a, 116b. For example, each one can contribute one or more vibration bits, each indicative of a vibration. The vibration processor 116 is described more fully below. Additional description of the vibration processor 116 can also be found in U.S. Pat. No. 8,446,146, entitled "Motion Sensor, Method, and Computer-Readable Storage Medium Providing a Motion Sensor with a Validated Output Signal from the Motion Sensor" issued on May 21, 2013 and incorporated herein by reference in its entirety.

The motion sensor 102 can also include an automatic offset adjusting (AOA) processor 114 together with an automatic gain control (AGC) processor 114, herein referred to together as an AOA/AGC processor 114. The AOA/AGC processor 114 is coupled to receive the R_DDIFF signal 110a, the L_DDIFF signal 126a, and the amplitude difference flag signal, AMP_DIFF_FLAG, 116b. The AOA/AGC processor 114 is configured to generate right and left channel gain control signals 114d, 114f, respectively, and also right and left channel offset control signals 114c, 114e, respectively, to control gain and offset of the offset and gain adjust modules 108, 124. The AOA/AGC processor 114 is also configured to generate signals R_AGC and L_AGC 114a, 114b, respectively, which are signals representative of the gain control signals 114d, 114f, respectively. In some alternate embodiments, the AOA/AGC processor 114 is instead only an AOA processor or an AGC processor.

The motion sensor 102 can include an output protocol processor 118 coupled to receive the R_POSCOMP signal 112a, the L_POSCOMP signal 128a, and the FLAG signals 116a. The output protocol processor 118 is configured to generate a motion signal 118a indicative of a motion (rotation) of the gear 100 and also indicative of the vibration of one or more of the magnetic field sensing elements 104a-104c and/or of the gear 102. The output protocol processor 118 can include a direction validation processor 120 configured to process the R_POSCOMP signal 112a, the L_POSCOMP signal 128a, and the FLAG signal 116a to generate the motion signal 118a.

In some embodiments, the motion signal 118a is a single bit digital signal having a frequency related to the speed of rotation of the gear 100, and a selected one of two pulse widths indicative of a direction of rotation of the gear 100. In some embodiments, the motion signal 118a is blanked (i.e., is inactive) when the FLAG signal 116a is indicative of a vibration. In some embodiments, upon a first power up of the motion sensor 102, the motions signal 118a is blanked (or otherwise does not indicate a direction of rotations) up until a valid time, after which it become active. Identification of the valid time is also described in above-incorporated U.S. Pat. No. 8,446,146. However, in other embodiments, the motion signal 118a can indicate aspects of the rotation of the gear 100 in other ways, and the above-described vibration can be represented in other ways. Exemplary output signals with different protocols are described in U.S. patent application Ser. No. 12/183,367, filed Jul. 31, 2008, in U.S.

Pat. No. 6,815,944, issued Nov. 9, 2004, and in U.S. Pat. No. 7,026,808, issued Apr. 11, 2006.

Having considered the motion sensors 10 and 102 of FIGS. 1 and 2, it will be appreciated that motion sensors according to the disclosure can be implemented in various manners, including a custom electronic device having electronic components, for example, gates, configured to implement the various processors and modules described herein. In some embodiments, the motion sensor includes a central processing unit and memory configured to implement the various processors and modules described herein.

Figure 3:
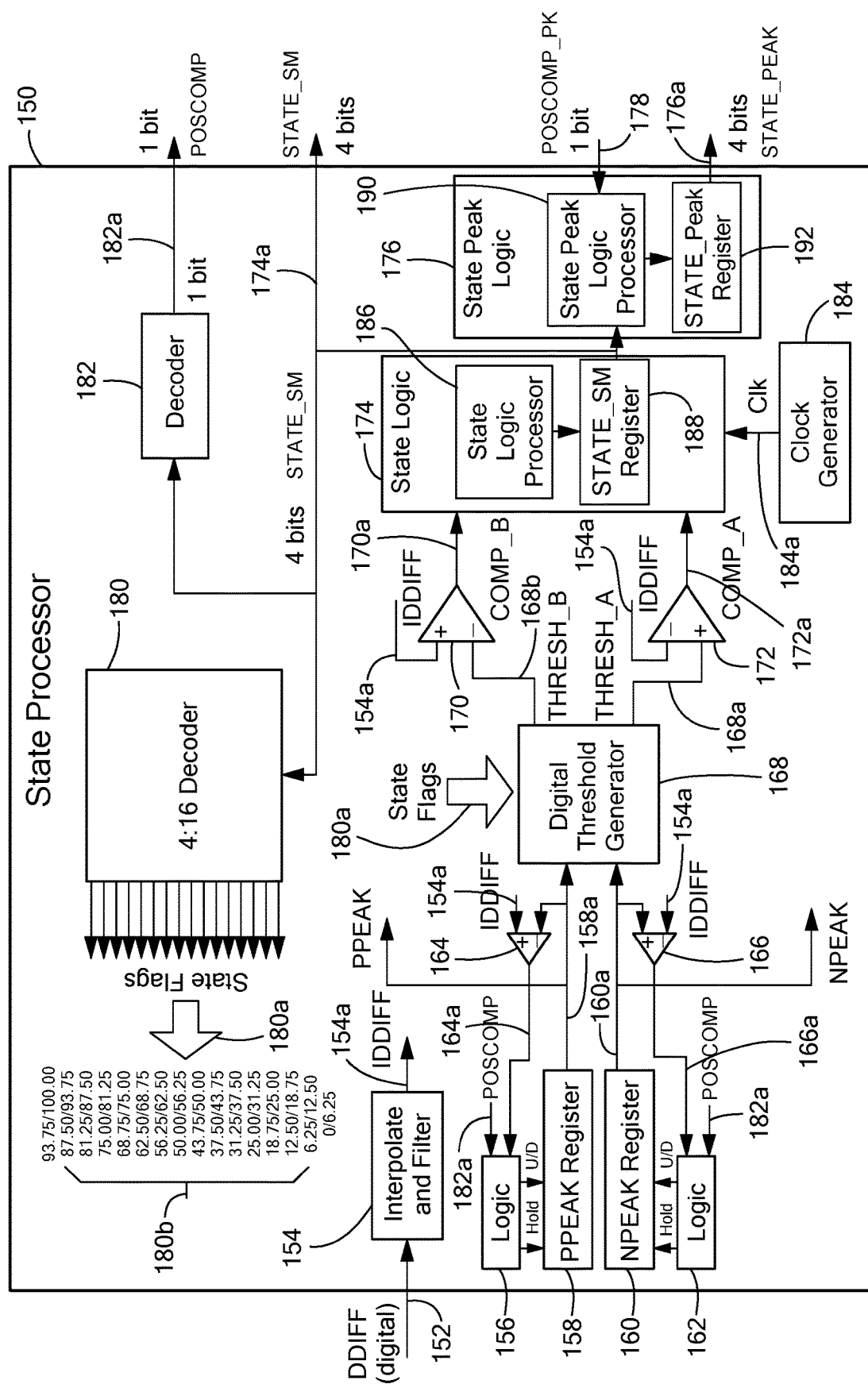
FIG. 3 is a block diagram showing further details of one of the two state processors of FIG. 2, including a state logic module and a state peak logic module.

Referring now to FIG. 3, a state processor 150 can be the same as or similar to each one of the state processors 112, 128 of FIG. 2, but is shown here for only one of the left or the right channels of FIG. 2. The state processor 150 is coupled to receive a DDIFF signal 152, which can be the same as or similar to the R_DDIFF signal 110a or the L_DDIFF signal 126a of FIG. 2. In FIG. 3, the right and left channel designations (R and L) are omitted since the state processor 150 can be the same in the right and left channels.

In some embodiments, the state processor 150 can include an interpolation and filtering module 154 coupled to receive the DDIFF signal 152 and configured to generate an interpolated digital DIFF signal (IDDIFF) 154a. The interpolation and filtering can be performed in a variety of ways to result in the IDDIFF signal 154a having a higher resolution and sampling rate than the DDIFF signal 152. In some embodiments, the DDIFF signal 152 has a sample rate of about three hundred thousand samples per second, and each sample is a nine-bit word. In some embodiments, the IDDIFF signal 154a has a sample rate of about 2.7 million samples per second (nine times the DDIFF rate), and each sample is a nine-bit word.

In some embodiments the interpolation and filter module 154 performs a six stage cascaded integrator comb (CIC) (a second order CIC) interpolating filter, with stages $1-z^{-9}$, $1-z^{-9}$, x9, $1/(1-z^{-1})$, $1/(1-z^{-1})$, and ⅟₈₁, for a transfer function of:

$$[1-2z^{-9}+z^{-18}]/[81(1-2z^{-1}+z^{-2})]$$

Other types of interpolation and filter modules can also be used, for example, a linear interpolation filter, a quadratic interpolation filter, or an exponential interpolation filter.

The state processor 150 includes a PPEAK register 158 (which, in some embodiments, can be a counter), which can hold or count up or count down, under the control of a first logic circuit 156. The first logic circuit 156 is responsive to a POSCOMP signal 182a (which can be the same as or similar to the R_POSCOMP signal 112a or the L_POSCOMP signal 128a of FIG. 2) and to a comparator output signal 164a generated by a comparator 164. The PPEAK register 158 holds values that contribute to a PPEAK signal 158a that tracks positive peaks of the IDDIFF signal 154a.

Similarly, the state processor 150 includes an NPEAK register 160 (which, in some embodiments, can be a counter), which can hold or count up or count down, under the control of a second logic circuit 162. The second logic circuit 162 is responsive to the POSCOMP signal 182a and to a comparator output signal 166a generated by a comparator 166. The NPEAK register 160 holds values that contribute to an NPEAK signal 160a that tracks negative peaks of the IDDIFF signal 154a. Comparators 164, 166 are digital comparators coupled to receive digital signals and configured to generate digital output signals.

Generation of the PPEAK signal 158a and the NPEAK signal 160a is further described below in conjunction with FIG. 5. However, let it suffice here to say that the PPEAK signal 158a and the NPEAK signal 160a are generally DC digital signals, wherein a difference between the PPEAK signal 158a and the NPEAK signal 160a is representative of a peak-to-peak amplitude of the IDDIFF signal 154a.

The state processor 150 can also include a digital threshold generator 168 coupled to receive the PPEAK signal 158a and the NPEAK signal 160a. Under control of a STATE FLAGS signal 180a, the digital threshold generator 168 is configured to generate selected threshold signals 168a, 168b that are at determined percentages of the peak-to-peak amplitude of the IDDIFF signal 154a. For example, for one time period, the threshold signals 168a, 168b can be near 31.25% and 37.50%, respectively, of the peak-to-peak amplitude of the IDDIFF signal 154a.

The two threshold signals 168a, 168b (also referred to a THRESH_A and THRESH_B) are received by comparators 172, 170, respectively, which are digital comparators. The comparators 170, 172 are also coupled to receive the IDDIFF signal 154a. The comparator 170 is configured to generate a COMP_B comparison signal 170a and the comparator 172 is configured to generate a COMP_A comparison signal 172a. It will be recognized that the comparators 170, 172 operate as a window comparator, and from the signals 170a, 172a, it can be deduced if the IDDIFF signal 154a is between the thresholds THRESH_A 168a and THRESH_B 168b.

The THRESH_A and THRESH_B signals 168a, 168b represent a pair of digital values selected to be one of sixteen pairs of values 180b. Therefore, at any instant in time, the comparators 170, 172 are able to identify in which of the sixteen ranges of values 180b the IDDIFF signal 154a resides. The ranges 180b are also referred to herein as states of the IDDIFF signal 154a (or states of the corresponding DIFF or DDIFF signals).

The state processor 150 can also include a state logic module 174 coupled to receive the COMP_A and COMP_B signals, 172a, 170a, respectively. The state logic module 174 decodes the state information associated with the COMP_A and COMP_B signals 172a, 170a and provides a 4-bit STATE_SM signal 174a and is also described in above-incorporated U.S. Pat. No. 8,446,146. The STATE_SM signal 174a is indicative of states, i.e., ranges, through which the IDDIFF signal 154a progresses. The state logic module 174 can include a state logic processor 186 coupled to a STATE_SM register 188, which is configured to hold values (e.g., one value at a time, progressively) of the STATE_SM signal 174a.

The state processor 150 can also include a state peak logic module 176 coupled to receive the STATE_SM signal 174a and a POSCOMP_PK signal 178 describe more fully below. The state peak logic module 176 is configured to generate a STATE_PEAK signal 176a, which is similar to the STATE_SM signal 174a, but which has transitions with fewer transition errors (chatter). The transition errors are described more fully below. The state peak logic module 176 can include a state peak logic processor 190 coupled to a STATE_PEAK register 192, which is configured to hold values of the STATE_PEAK signal 176a.

The state processor 150 can also include a 4:16 decoder 180 coupled to receive the STATE_SM signal 174a. The 4:16 decoder 180 is configured to provide one of sixteen control signals, i.e., STATE FLAGS 180a, as shown. Each one of the flags is indicative of a particular amplitude range from among a plurality of amplitude ranges 180b. The amplitude ranges 180b are expressed as percentages of a peak-to-peak range of the IDDIFF signal 154a. While particular amplitude ranges 180b are shown, it will be understood that the amplitude ranges can be different than those shown, and need not be linearly configured.

The state processor 150 can also include a decoder 182 coupled to receive the STATE_SM signal 174a and configured to generate the POSCOMP signal 182a having transitions at times of particular ones of the state transitions within the STATE_SM signal 174a. The state processor 150 can also include a clock generator circuit 184 that provides a clock signal, CLK, 184a to clock the state logic module and other processors and modules within the state processor 150.

Figure 4:
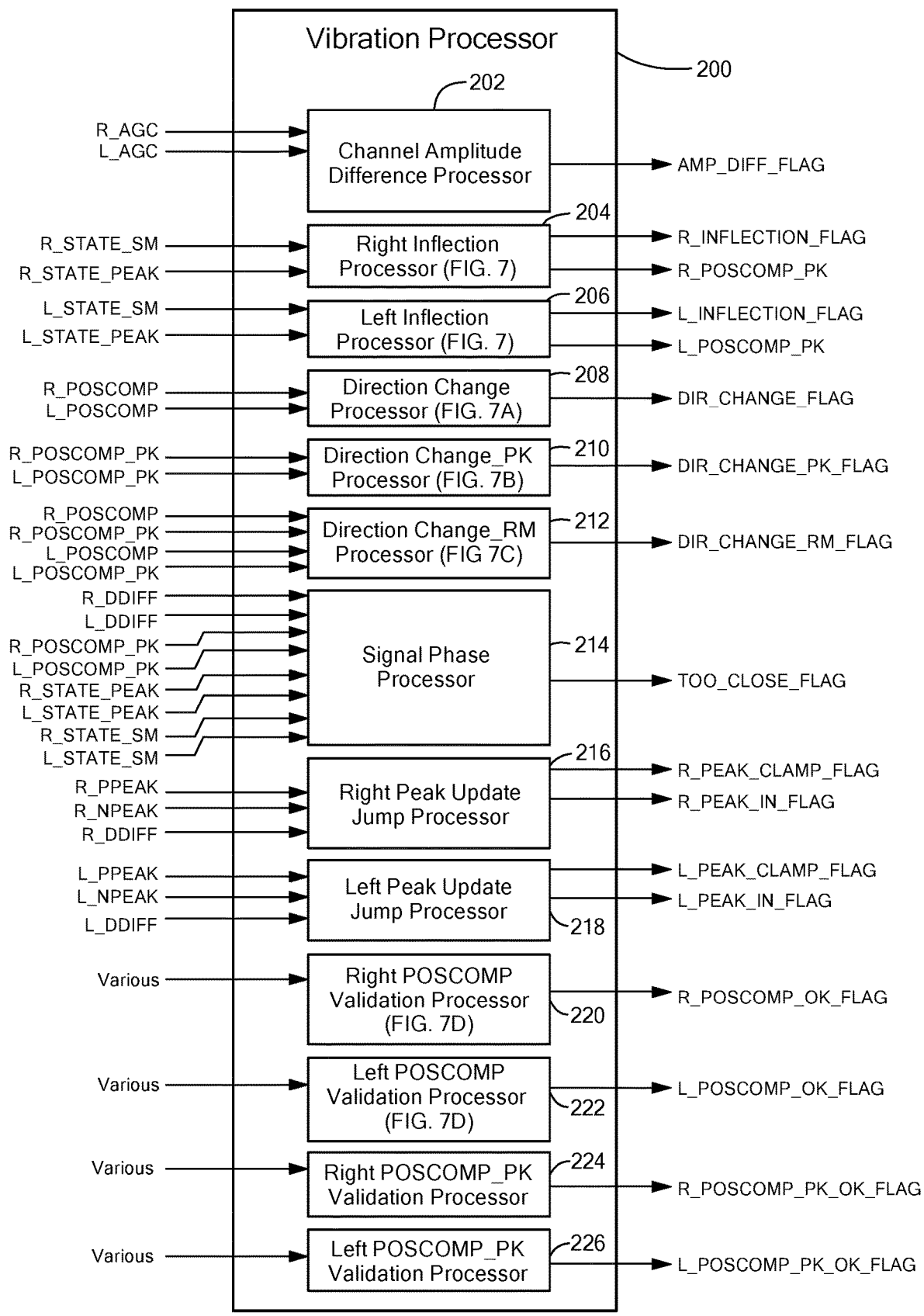
FIG. 4 is a block diagram showing portions of the vibration processor of FIG. 2.

Referring now to FIG. 4, a vibration processor 200 can be the same as or similar to the vibration processor 116 of FIG. 2. The vibration processor 200 is coupled to receive many signals from the right and left channels of the motion sensor 102 of FIG. 2. The vibration processor 200 is configured to process the various input signals and to generate a plurality of flag signals, which can be single bit two-state signals.

In particular, the vibration processor 200 can include a channel amplitude difference processor 202 configured to receive the signals R_AGC and L_AGC representative of the right and left gain control signals 114d, 114f of FIG. 2, and also may be coupled to receive the R_DDIFF signal 110a and the L_DDIFF signal 126a of FIG. 2. The channel amplitude difference processor 202 is configured to generate an AMP_DIFF_FLAG signal representative of the right and left gain control signals 114d, 114f differing by more than a predetermined amount, which tend to be representative of a vibration the object 100 of FIG. 2. Operation of the channel amplitude difference processor 202 is also described in above-incorporated U.S. Pat. No. 8,446,146.

The vibration processor 200 can also include right and left inflection processors 204, 206, respectively. The right inflection processor 204 is coupled to receive the R_STATE_SM signal of FIG. 2 (see also the STATE_SM signal 174a of FIG. 3) and the R_STATE_PEAK signal of FIG. 2 (see also the STATE_PEAK signal 176a of FIG. 3). The right inflection processor 204 is configured to generate a R_INFLECTION_FLAG signal indicative of a change of direction of the object 100 of FIG. 2 and also to generate the R_POSCOMP_PK signal of FIG. 2 (see also the POSCOMP_PK signal 178 of FIG. 3). The R_INFLECTION_FLAG signal may generally be referred to as an "INFLECTION" herein.

The left inflection processor 206 is coupled to receive the L_STATE_SM signal of FIG. 2 (see also the STATE_SM signal 174a of FIG. 3) and the L_STATE_PEAK signal of FIG. 2 (see also the STATE_PEAK signal 176a of FIG. 3). The left inflection processor 206 is configured to generate a L_INFLECTION_FLAG signal indicative of a change of direction of the object 100 of FIG. 2 and also to generate the L_POSCOMP_PK signal of FIG. 2 (see also the POSCOMP_PK signal 178 of FIG. 3). The L_INFLECTION_FLAG signal may generally be referred to as an "INFLECTION" herein.

Generation of the R_POSCOMP_PK signal and the L_POSCOMP_PK signal is described more fully below. Operation of the inflection processors 204, 206 is further described below in conjunction with FIG. 7.

The vibration processor 200 can also include a direction change processor 208 coupled to receive the R_POSCOMP signal 112a and the L_POSCOMP signal 128a of FIG. 2 (see also the POSCOMP signal 182a of FIG. 3). The direction change processor 208 is configured to generate a DIR_CHANGE_FLAG signal indicative of a change of direction of the object 100 of FIG. 2. Operation of the direction change processor 208 is further described below in conjunction with FIG. 7A. The DIR_CHANGE_FLAG signal may generally be referred to as a "DIR_CHANGE" herein.

The vibration processor 200 can also include a direction change_PK processor 210 coupled to receive the R_POSCOMP_PK signal and the L_POSCOMP_PK signal of FIG. 2 (see also the POSCOMP_PK signal 178 of FIG. 3 and the R_POSCOMP_PK signal generated by the right inflection processor 204 and the L_POSCOMP_PK signal generated by the left inflection processor 206). The direction change_PK processor 210 is configured to generate a DIR_CHANGE_PK_FLAG signal indicative of a change of direction of the object 100 of FIG. 2. Operation of the direction change_PK processor 210 is further described below in conjunction with FIG. 7B. The DIR_CHANGE_PK_FLAG signal may generally be referred to as "DIR_CHANGE_PK" herein.

The vibration processor 200 can also include a direction change_RM (running mode) processor 212 coupled to receive the R_POSCOMP signal, the L_POSCOMP signal, the R_POSCOMP_PK signal, and the L_POSCOMP_PK signal. The direction change_RM processor 212 is configured to generate a DIR_CHANGE_RM_FLAG signal indicative of a change of direction of the object 100 of FIG. 2. Operation of the direction change_RM processor 212 is further described below in conjunction with FIG. 7C. The DIR_CHANGE_RM_FLAG signal may generally be referred to as "DIR_CHANGE_RM" herein.

The vibration processor 200 can also include a signal phase processor 214 coupled to receive the R_DDIFF signal, the L_DDIFF signal, the R_POSCOMP_PK signal, the L_POSCOMP_PK signal, the R_STATE_PK signal, the L_STATE_PK signal, the R_STATE_SM signal, and the L_STATE_SM signal of FIG. 2 (see also the STATE_PEAK signal 176a and the STATE_SM signal 174a of FIG. 3). The signal phase processor 214 is configured to generate a TOO_CLOSE_FLAG signal indicative of signals in the right and left channels being too close in phase and therefore, a vibration of the object 100 of FIG. 2. Operation of the signal phase processor 214 is also described in above-incorporated U.S. Pat. No. 8,446,146.

The vibration processor 200 can also include right and left peak update jump processors 216, 218, respectively. The right peak update jump processor 216 is coupled to receive the R_PPEAK signal and the R_NPEAK signal of FIG. 2 (see also the PPEAK and NPEAK signals 158a, 160a, respectively, of FIG. 3) and the R_DDIFF signal. The left peak update jump processor 218 is coupled to receive the L_PPEAK signal and the L_NPEAK signal of FIG. 2 (see also the PPEAK and NPEAK signals 158a, 160a, respectfully, of FIG. 3) and the L_DDIFF signal. The right peak update jump processor 216 is configured to generate an R_PEAK_CLAMP_FLAG signal indicative of a right channel magnetic field signal increasing being too large in amplitude and an R_PEAK_IN_FLAG signal indicative of the right channel magnetic field signal being too small in amplitude. The left peak update jump processor 218 is configured to generate an L_PEAK_CLAMP_FLAG signal indicative of a left channel magnetic field signal being too large in amplitude and an L_PEAK_IN_FLAG signal indicative of the left channel magnetic field signal being too small in amplitude. Operation of the peak update jump processors 216, 218 is also described in above-incorporated U.S. Pat. No. 8,446,146.

The vibration processor 200 can also include right and left POSCOMP validation processors 220, 222, respectively. The right and left POSCOMP validation processors 220, 222 are coupled to receive various input signals as will become apparent from the discussion below in conjunction with FIG. 7D. The right POSCOMP validation processor 220 is configured to generate an R_POSCOMP_OK_FLAG signal indicative of a proper R_POSCOMP signal. The R_POSCOMP_OK_FLAG signal may generally be referred to as POSCOMP_RIGHT herein. The left POSCOMP validation processor 222 is configured to generate an L_POSCOMP_OK_FLAG signal indicative of a proper L_POSCOMP signal. The L_POSCOMP_OK_FLAG signal may generally be referred to as POSCOMP_LEFT herein. Operation of the POSCOMP validation processors 220, 222 is further described below in conjunction with FIG. 7D.

The vibration processor 200 can also include right and left POSCOMP_PK validation processors 224, 226, respectively. The right and left POSCOMP_PK validation processors 224, 226 are coupled to receive various input signals. The right POSCOMP_PK validation processor 224 is configured to generate an R_POSCOMP_PK_OK_FLAG signal indicative of a proper R_POSCOMP_PK signal. The left POSCOMP_PK validation processor 226 is configured to generate an L_POSCOMP_PK_OK_FLAG signal indicative of a proper L_POSCOMP_PK signal. Operation of the POSCOMP_PK validation processors 224, 226 is also described in above-incorporated U.S. Pat. No. 8,446,146.

Referring now to FIG. 5, a graph has a vertical axis with units of voltage in volts and a horizontal axis with units in arbitrary units of time. A signal 372 is representative of a DIFF signal, for example, one of the R_DIFF signal 108*a* or the L_DIFF signal 124*a* of FIG. 2. The signal 372 is also representative of a DDIFF signal, for example, one of the R_DDIFF signal 110*a* or the L_DDIFF signal 126*a* of FIG. 2, but in analog form. More particularly, the signal 372 can be representative of the IDDIFF signal 154*a* of FIG. 3.

Figure 7:
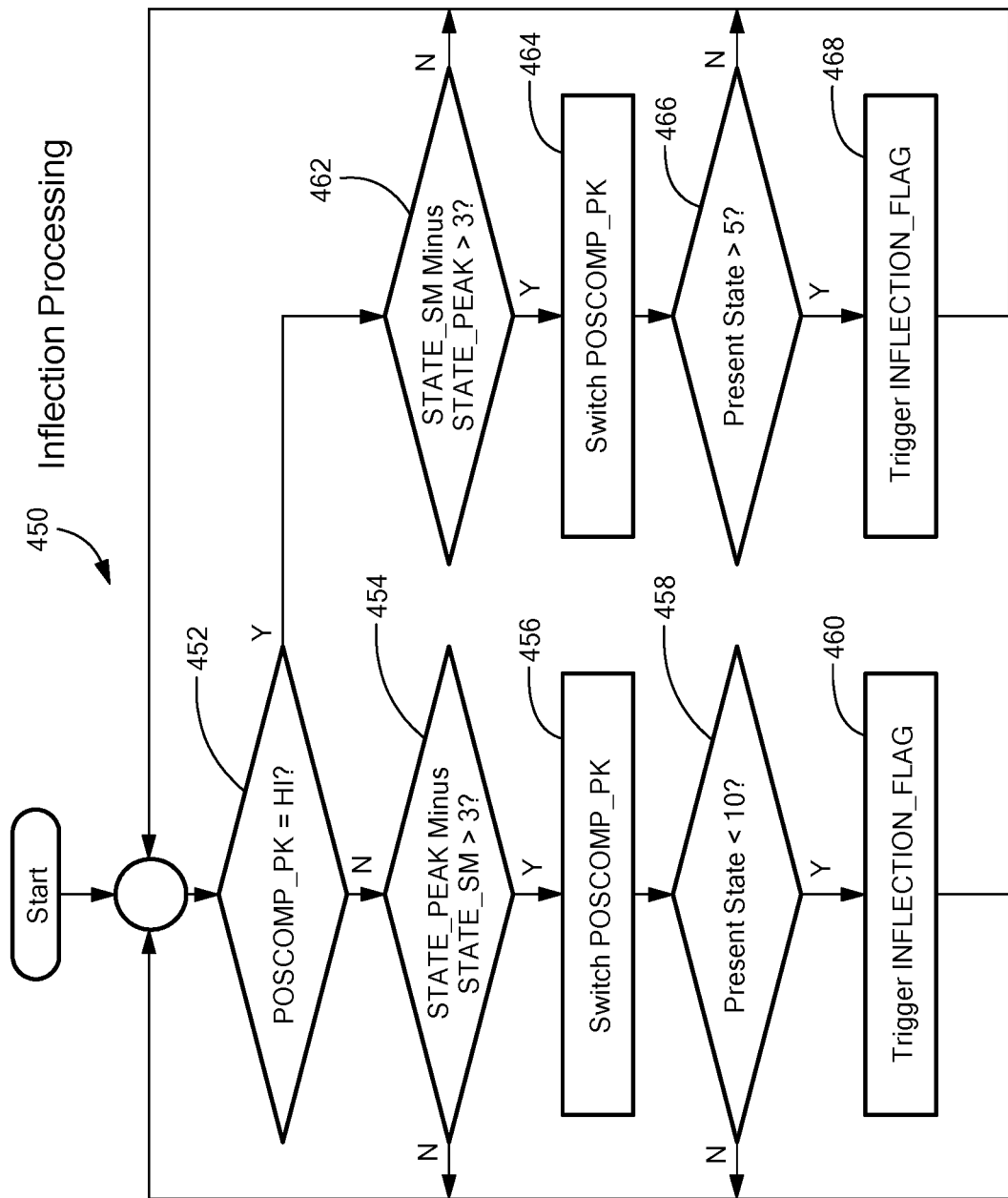
FIG. 7 is a flow chart showing inflection processing that can be used in the inflection processors of FIG. 4.

The signal 372 passes through a plurality of states, identified as STATE0 to STATE15 in FIG. 7, of which states 374*a*, 374*b* are representative. Each state is indicative of a range of values, which, in relation to a DIFF signal (an analog signal), is indicative of an analog range of values, and which, in relation to a DDIFF signal (a digital signal), is indicative of a digital range of values, and which, in relation to an IDDIFF signal (a digital signal), is also indicative of a digital range of values. The digital ranges of values, in turn, are indicative of the analog ranges of values of the DIFF signal. Exemplary ranges of values (in percentages of peak to peak range of the DIFF signal, DDIFF signal, or IDDIFF signal) associated with STATE0 to STATE15 are identified as element 180*b* in FIG. 3.

A state signal 392 is representative of states that the DIFF signal falls into with time, which is the same as or similar to the STATE_SM signal 174*a* of FIG. 3. Thus, the DIFF signal 372 as shown, at sometimes is in STATE0, at other times in STATE1, and so on. It will be understood that at the positive peak of the DIFF signal 372, STATE15, is achieved and identified as element 392*a*. The DIFF signal 372 can continue above the line at STATE15 374*a*, and the DIFF signal 372 is still within the STATE15 392*a*, until the DIFF signal drops below STATE15 392*a*.

A signal 376 having regions 376*a*, 376*b* is representative of the PPEAK signal 158*a* of FIG. 3. A signal 378, including regions 378*a*, 378*b* is representative of the NPEAK signal 160*a* of FIG. 3. The PPEAK signal 376 generally holds a value representative of an amplitude of a positive peak of the DIFF signal 372. The NPEAK signal 378 generally holds a value representative of an amplitude of a negative peak of the DIFF signal 372.

The regions 376*a*, 376*b* are representative of times that the PPEAK signal 376 counts or otherwise transitions downward to reacquire the DIFF signal 372, then counts or otherwise transitions upward again to acquire the positive peak of the DIFF signal 372, by way of operation of the logic 156 and comparator 164 of FIG. 3. Similarly, the regions 378*a*, 378*b* are representative of times that the NPEAK signal 378 counts or otherwise transitions upward to reacquire the DIFF signal 372, then counts or otherwise transitions downward again to acquire the negative peak of the DIFF signal 372, by way of operation of the logic 162 and comparator 166 of FIG. 3. Points 380*a*, 380*b* are indicative of the DIFF signal transitioning from the tenth state, STATE10 to the eleventh state, STATE11. Points 382*a*, 382*b* are indicative of the DIFF signal transitioning from the fifth state, STATE5, to the fourth state, STATE4.

It will be apparent that the start of the regions 376*a*, 376*b* are coincident with the points 380*a*, 380*b*, respectively. It will also be apparent that the start of the regions 378*a*, 378*b* are coincident with the points 382*a*, 382*b*, respectively. It will become apparent from discussion below in conjunction with FIG. 5A, that the points 380*a*, 380*b*, 382*a*, 382*b*, are also coincident with transitions of the POSCOMP signal. Points 384*a*, 384*b* are indicative of the DIFF signal changing states from STATE15 to four states below STATE15, i.e., a change to STATE 11, represented by a state difference 390. Points 386*a*, 386*b* are indicative of the DIFF signal changing from STATE0 to a state that is four states above STATE0, i.e., a change to STATE 4, represented by a state difference 388. It will become apparent from discussion below in conjunction with FIG. 5A, that the points 384*a*, 384*b*, 386*a*, 386*b* are also coincident with transitions of the POSCOMP_PK signal.

Some state chatter (inappropriate state transitions), typified by state chatter 392, can be present during state transitions. State transition chatter is associated with the STATE_SM signal 174*a* of FIG. 3. The state transition chatter is essentially reduced or eliminated by the state peak logic module 176 of FIG. 3 by processes described below, to result in the STATE_PEAK signal 176*a* of FIG. 3 with reduced state chatter or with no state chatter.

Referring now to FIG. 5A, a graph 400 has a vertical axis with units of voltage in volts and a horizontal axis with arbitrary units of time, aligned in time with the horizontal axis of FIG. 7. A signal 402 is representative of the POSCOMP signal 182*a* of FIG. 3. As described above, transitions 404*a*,404*b* and 406*a*, 406*b* of the POSCOMP signal 402 are coincident with, and result from (by way of the decoder 182 of FIG. 3), the state transitions and associated points 360*a*, 360*b*, and 362*a*, 362*b* of FIG. 5.

A signal 408, shown in phantom lines, is representative of the POSCOMP_PK signal 178 of FIG. 3, which is generated during a process described below in conjunction with FIG. 7. As described above, transitions 410*a*, 410*b* and 412*a*, 412*b* of the POSCOMP_PK signal 408 are coincident with, and result from (by way of the process of FIG. 7) the state transitions and associated points 364*a*, 364*b*, and 366*a*, 366*b* of FIG. 5.

Figure 6:
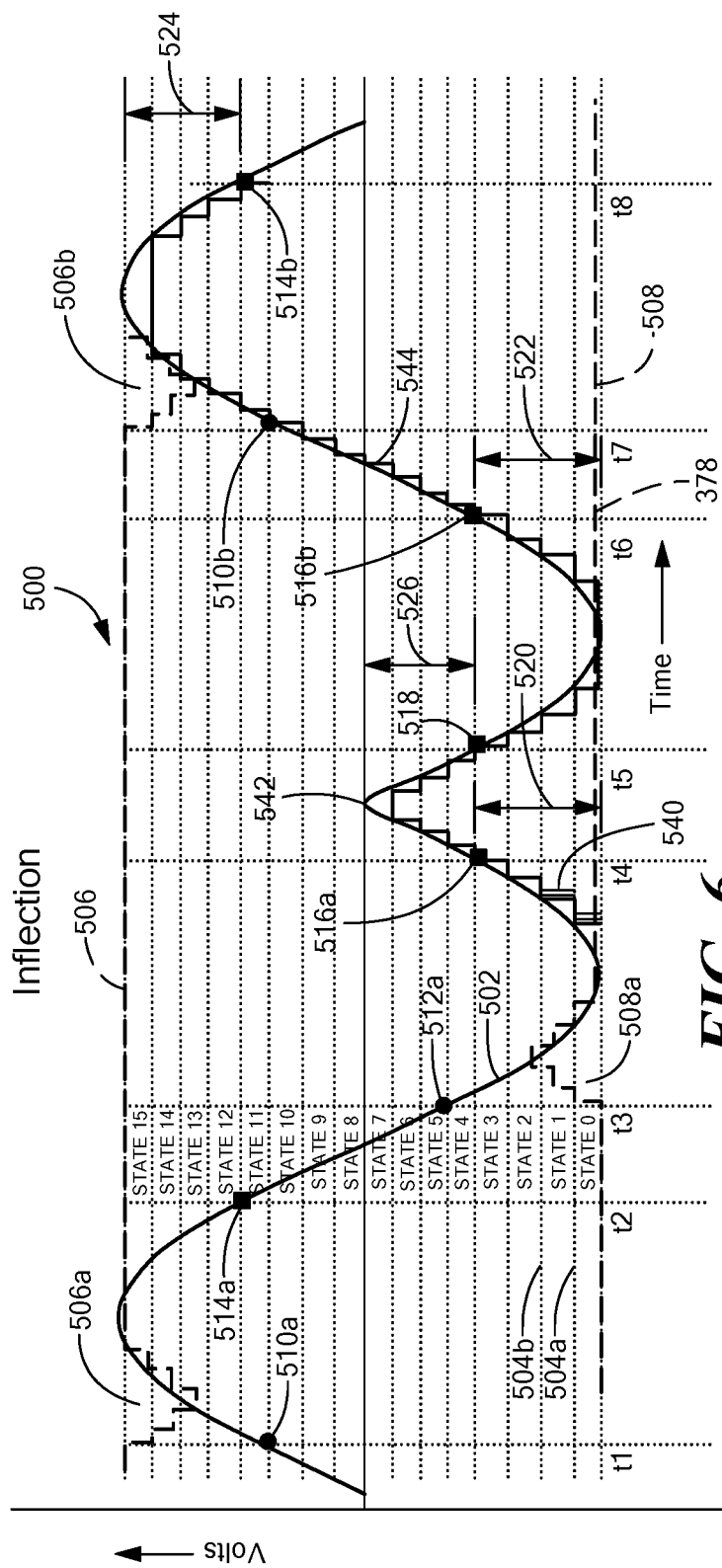
FIG. 6 is a graph showing a DIFF signal and associated states of the motion sensor of FIG. 1 when an inflection (change of direction) occurs.

Referring now to FIG. 6, a graph 500 has a vertical axis with units of voltage in volts and a horizontal axis with arbitrary units of time. A signal 502 is representative of a DIFF signal, for example, one of the R_DIFF signal 108*a* or the L_DIFF signal 124*a* of FIG. 2. The signal 502 is also representative of a DDIFF signal, for example, one of the R_DDIFF signal 110*a* or the L_DDIFF signal 126*a* of FIG. 2.

As in FIG. 5, the signal 502 passes through a plurality of states, identified as STATE0 to STATE15, of which states 504a, 504b are representative. Each state is indicative of a range of values, which, in relation to a DIFF signal (an analog signal), is indicative of an analog range of values, and which, in relation to a DDIFF signal (a digital signal), is indicative of a digital range of values, and which, in relation to an IDDIFF signal (a digital signal), is also indicative of a digital range of values. The digital ranges of values, in turn, are indicative of the analog ranges of values of the DIFF signal. As described above, exemplary ranges of values (in percentages of peak to peak range of the DIFF signal, DDIFF signal, or IDDIFF signal) associated with STATE0 to STATE15 are identified as element 180b in FIG. 3.

A state signal 544 is representative of states that the DIFF signal falls into with time, and is the same as or similar to the STATE_SM signal 174a of FIG. 3. Thus, the DIFF signal 502 as shown, at some times is in STATE0, at other times in STATE1, and so on. The DIFF signal 502 differs from the DIFF signal 372 of FIG. 5, in that it has an inflection 542, indicative of a mid-cycle change of the DIFF signal 502, as may result from a direction change, for example, a rotational direction change of the object 100 of FIG. 2, or as may result from a rotational vibration of the object 100.

A signal 506 having regions 506a, 506b is representative of the PPEAK signal 158a of FIG. 3. A signal 508, including a region 508a is representative of the NPEAK signal 160a of FIG. 3. The PPEAK signal 506 generally holds a value representative of an amplitude of a positive peak of the DIFF signal 502. The NPEAK signal 508 generally holds a value representative of an amplitude of a negative peak of the DIFF signal 502.

The regions 506a, 506b are representative of times that the PPEAK signal 506 counts or otherwise transitions downward to reacquire the DIFF signal 502, then counts or otherwise transitions upward again to acquire the positive peak of the DIFF signal 502, by way of operation of the logic 156 and comparator 164 of FIG. 3. Similarly, the region 508a is representative of times that the NPEAK signal 508 counts or otherwise transitions upward to reacquire the DIFF signal 502, then counts or transitions downward again to acquire the negative peak of the DIFF signal 502, by way of operation of the logic 162 and comparator 166 of FIG. 3. Points 510a, 510b are indicative of the DIFF signal 502 transitioning from the tenth state, STATE10, to the eleventh state, STATE11. Point 512a is indicative of the DIFF signal 502 transitioning from the fifth state, STATE5, to the fourth state, STATE4, but only after the point 510a.

It will be apparent that the starts of the regions 506a, 506b are coincident with the points 510a, 510b, respectively. It will also be apparent that the start of the region 508a is coincident with the point 512a. It will become apparent from discussion below in conjunction with FIG. 6A, that the points 510a, 512a, 510b are also coincident with transitions of the POSCOMP signal. Points 514a, 514b are indicative of the DIFF signal 502 changing states from STATE15 to have a state four states below STATE15, i.e., a change to STATE 11, represented by a state difference 524. Points 516a, 516b are indicative of the DIFF signal 502 changing from STATE0 to have a state that is four states above STATE0, i.e., a change to STATE4, represented by state differences 520, 522. It will become apparent from discussion below in conjunction with FIG. 6A, that the points 514a, 514b, 516a, 516b are also coincident with transitions of the POSCOMP_PK signal.

An additional point 518 is indicative of the DIFF signal 502 changing states from STATE8 to four states below STATE8, i.e., a change to STATE 4, represented by a state difference 526. It should be appreciated that the points 514a, 514b, and 518 are each indicative of a time when the state signal 544 decreases by four states. The points 516a, 516b are each representative of a time when the state signal 544 increase by four states. It will become apparent from discussion below in conjunction with FIG. 6A, that the point 518 is also coincident with a transition of the POSCOMP_PK signal.

Some state chatter (inappropriate state transitions), typified by state chatter 540, can be present during state transitions. State transition chatter is associated with the STATE_SM signal 174a of FIG. 3. The state transition chatter is essentially reduced or eliminated by the state peak logic module 176 of FIG. 3 by processes descried below, to result in the STATE_PEAK signal 176a of FIG. 3 with reduced state chatter or with no state chatter.

Figure 6A:
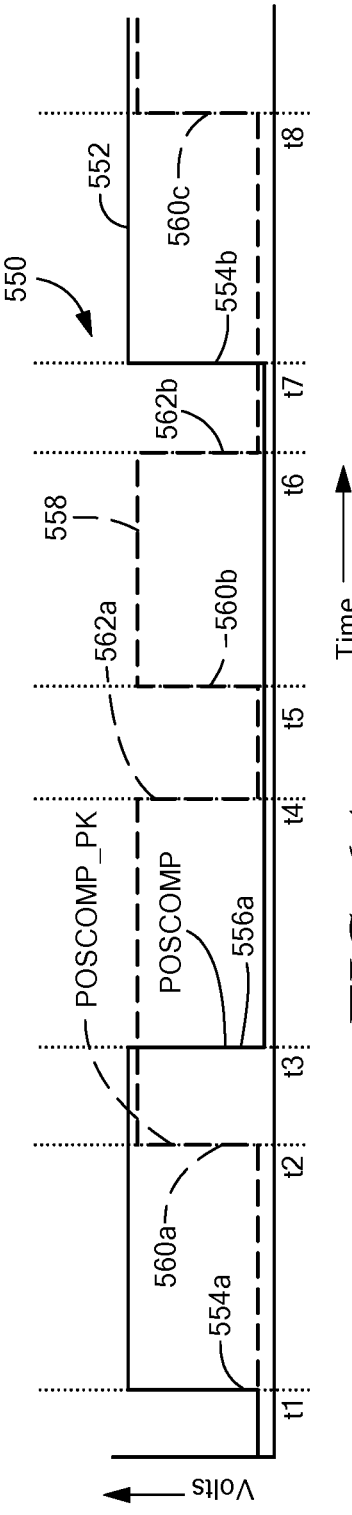
FIG. 6A is a graph showing POSCOMP and POSCOMP_PK signals and states derived from the DIFF signal of FIG. 6 by the motion sensor of FIG. 1.

Referring now to FIG. 6A, a graph 550 has a vertical axis with units of voltage in volts and a horizontal axis with arbitrary units of time, aligned in time with the horizontal axis of FIG. 6. A signal 552 is representative of the POSCOMP signal 182a of FIG. 3. As described above, transitions 554a, 554b, 556a of the POSCOMP signal 502 are coincident with, and result from (by way of the decoder 182 of FIG. 3), the state transitions and associated points 510a, 510b, 512a of FIG. 6.

A signal 558, shown in phantom lines, is representative of the POSCOMP_PK signal 178 of FIG. 3, which is generated during a process described below in conjunction with FIG. 7. As described above, transitions 560a, 560b, 560c, 562a, 562b of the POSCOMP_PK signal 558 are coincident with, and result from (by way of the process of FIG. 7) the state transitions and associated points 514a, 518, 514b, 516a, 516b of FIG. 6.

Figure 7A:
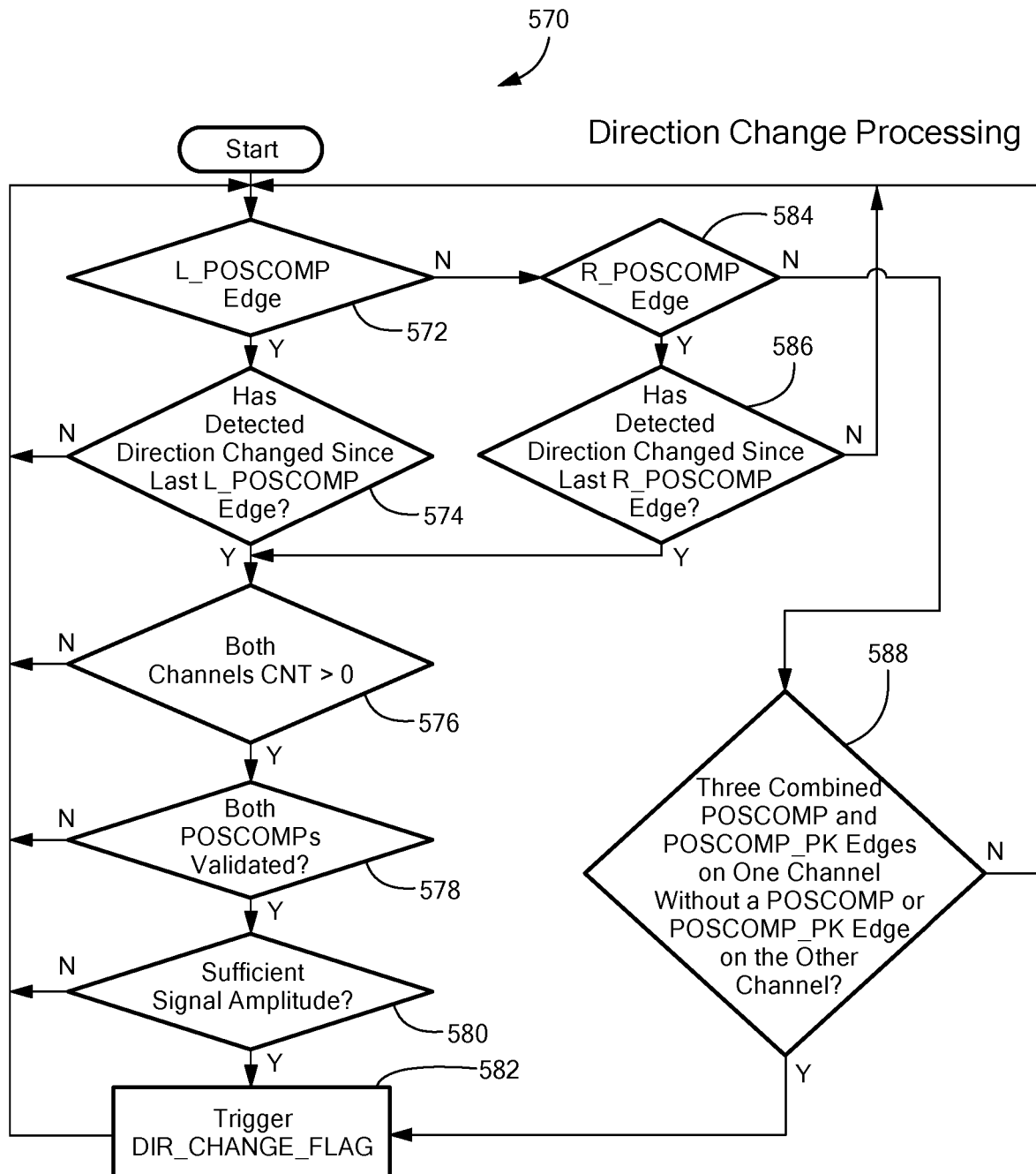
FIG. 7A is a flow chart showing direction change processing that can be used in the direction change processor of FIG. 4.
Figure 7B:
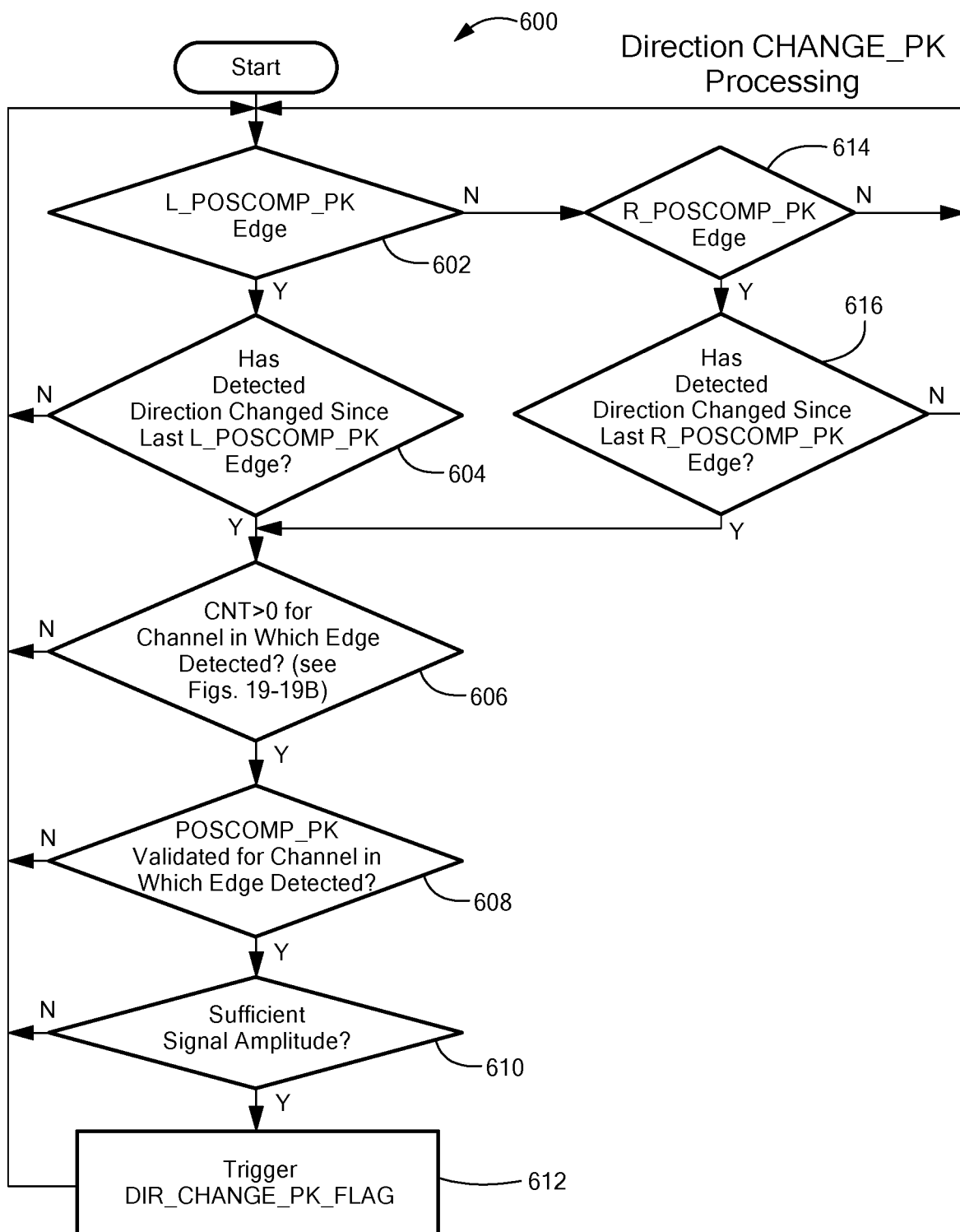
FIG. 7B is a flow chart showing direction change_PK processing that can be used in the direction change_PK processor of FIG. 4.
Figure 7C:
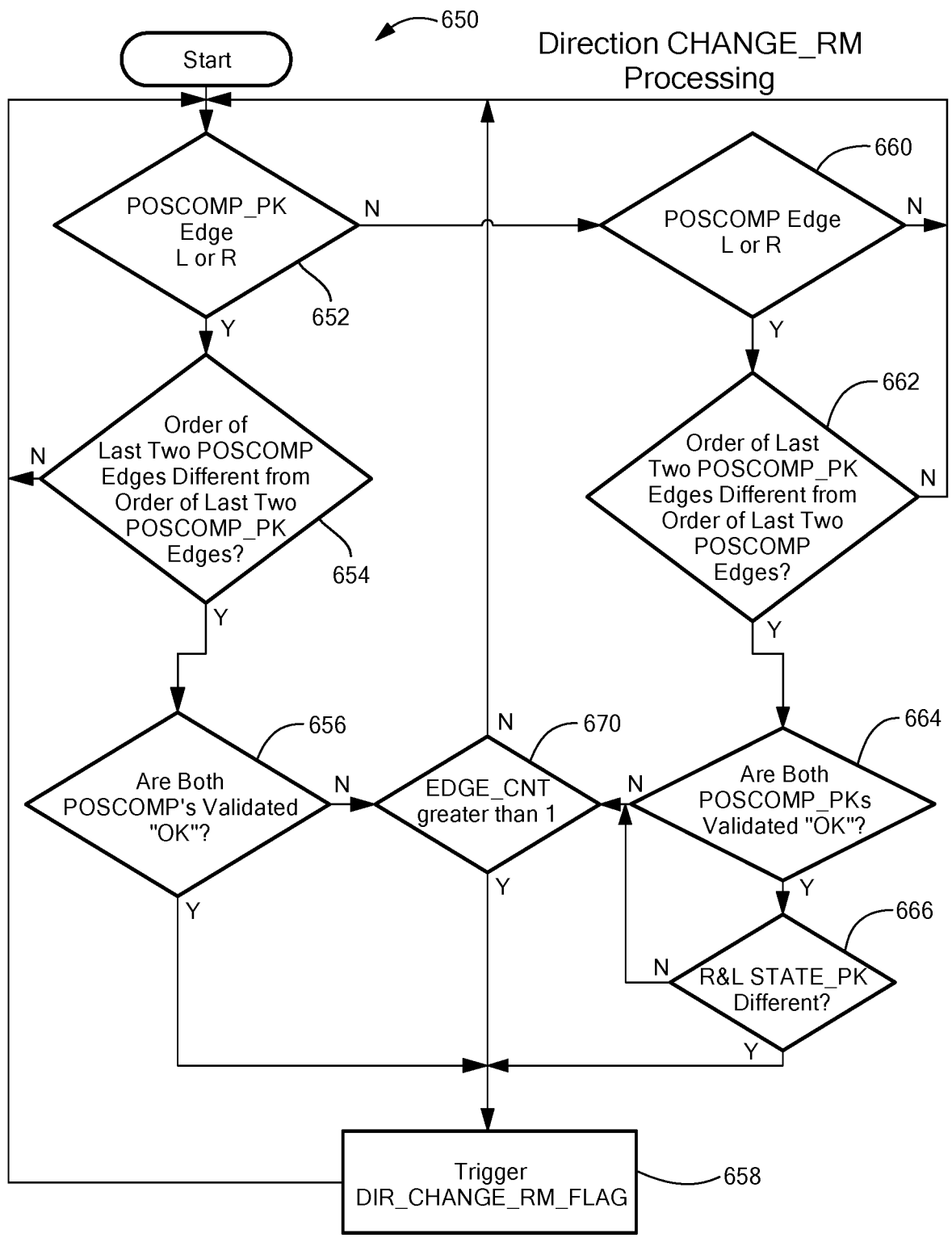
FIG. 7C is a flow chart showing direction change_RM processing that can be used in the direction change_RM processor of FIG. 4.
Figure 7D:
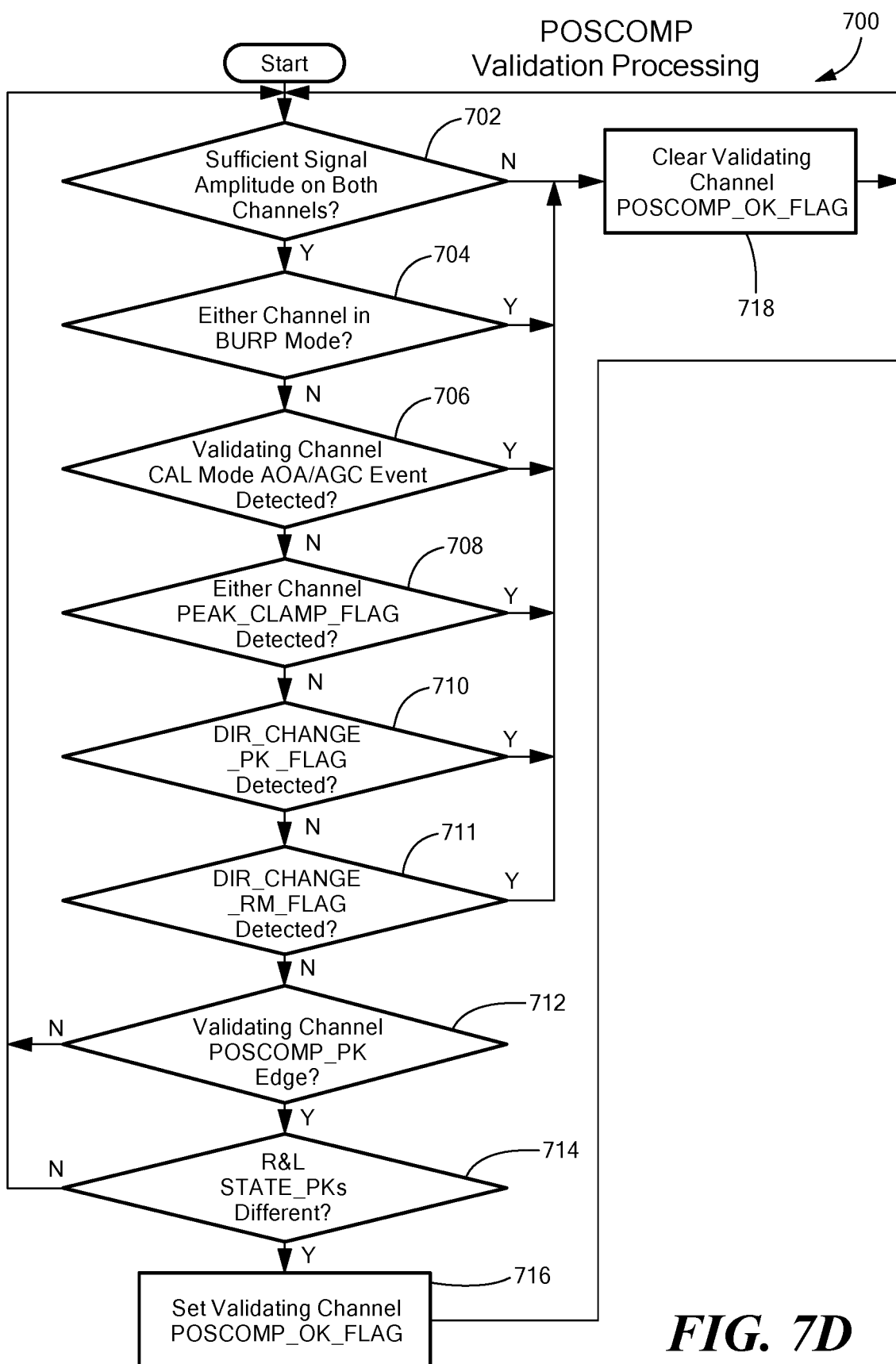
FIG. 7D is a flow chart showing POSCOMP_PK validation processing that can be used in the POSCOMP validation processors of FIG. 4.

FIGS. 7-7D show flowcharts associated with generating certain vibration flags used to identify a vibration. Each one of the processes of FIGS. 7-7D is initiated at a "start" block. The start block can be representative of a time when the motion sensor 10, 102 is first powered up, or any time thereafter, for example, at the end of a calibration or recalibration mode. Rectangular elements, herein denoted "processing blocks," represent computer software instructions or groups of instructions. Diamond shaped elements, herein denoted "decision blocks," represent computer software instructions, or groups of instructions, which affect the execution of the computer software instructions represented by the processing blocks. Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

The processes of FIGS. 7-7D are carried out by the various vibration sub-processors shown within a vibration processor 200 of FIG. 4, which can be the same as or similar to the vibration processor 116 of FIG. 2. However, it should be appreciated that the partitioning shown herein is but one exemplary partitioning of functions, shown for clarity. Any of the vibration sub-processors of FIG. 4 can be embodied within a different block of FIG. 2, for example, within the AOA/AGC processor 114 or within the state processors 112, 128.

Referring now to FIG. 7, an exemplary process 450 can be carried out, for a right channel, by the right inflection processor 204 of FIG. 4. The exemplary process 450 can also be carried out, for a left channel, by the left inflection processor 206 of FIG. 4. Operation for the two channels can be performed either in series or in parallel. The process 450 is described below with regard to one channel, either right or left. The process 450 is used to identify an inflection and therefore a change of direction of the object 100, which is indicative of a fault condition or a vibration. The process 450 also results in transitions of the POSCOMP_PK signal.

The process 450 is concerned with identifying inflections, for example, the inflection 542 of FIG. 6, which are changes of the DIFF, DDIFF, and/or IDDIFF signals brought about by an apparent or real change of direction, for example, an apparent change of rotational direction of the object 100 of FIG. 2. The apparent change of direction can be due to a vibration of the object 100. The apparent change of direction tends to be typified by a sudden change in phase of the DIFF, DDIFF, and IDDIFF signals, as shown above in conjunction with FIGS. 6 and 6A.

The process 450 begins at block 452, where it is identified if the POSCOMP_PK signal (e.g., the POSCOMP_PK signals of FIG. 2, the POSCOMP_PK signal 178 of FIG. 3, the POSCOMP_PK signals of FIG. 4, or the POSCOMP_PK signal 558 of FIG. 6A) is high. If the POSCOMP_PK signal is not high (i.e., low), then the process proceeds to block 454. At block 454, it is identified if a STATE_PEAK signal, e.g., the STATE_PEAK signal 176a of FIG. 3, minus the STATE_SM signal, e.g., the STATE_SM signal 174a of FIG. 3, which is represented by the state signal 544 of FIG. 6, is greater than three. In other words, their states differ by four or more. Generation of the STATE_PEAK signal is also described in above-incorporated U.S. Pat. No. 8,446,146. The difference of at least four states is represented by the state differences 524, 526 of FIG. 6. If the state difference is greater than three, the process proceeds to block 456, where the POSCOMP_PK signal is switched to the opposite state, i.e., to a high state. (see, e.g. point 518 of FIG. 6 in relation to edge 560b of FIG. 6A).

At block 458, if the present state, identified in the STATE_SM signal is less than or equal to ten, then the process proceeds to block 460, where an INFLECTION_FLAG signal is triggered, which can be the same as or similar to one of the inflection flag signals of FIG. 4. The process 450 then returns to block 452. As used herein, the term "triggered" refers to a momentary change of state of a flag signal, after which the flag signal reverts to its original state. The triggered state can exist, for example, for one cycle of the clock signal 184a of FIG. 3.

If at block 452, the POSCOMP_PK signal is high, then the process proceeds to block 462, where it is identified if a STATE_SM signal minus the STATE_PEAK signal is greater than three. In other words, their states differ by four or more. If the state difference is greater than three, the process proceeds to block 464, where the POSCOMP_PK signal is switched to the opposite state, i.e., to a low state. (see, e.g. point 516b of FIG. 6 in relation to edge 562b of FIG. 6A) At block 466 if the present state, identified in the STATE_SM signal is greater than five, then the process proceed to block 468, where the INFLECTION_FLAG signal is triggered and the process 450 returns to block 452. At blocks 454, 458, 462, 466, if the indicated conditions are false, then the process returns to block 452.

It should be recognized that edges of the POSCOMP_PK signal are a result of the process 450. The process 450 can continually scan the DDFF or IDDIFF signals for inflections and trigger the INFLECTION_FLAG of the right or left channel if an inflection is detected. The process 450 can continually generate the POSCOMP_PK signal.

Referring now to FIG. 7A, an exemplary process 570 can be performed by the direction change processor 208 of FIG. 4. The process 570 can be carried out for the two channels, right and left, either in series or in parallel. The process 570 is described below with regard to both channels. In general, it should be appreciated that a relative phase (plus or minus) between the R_POSCOMP signal 112a of FIG. 2 and the L_POSCOMP signal 128a of FIG. 2 is indicative of a direction of rotation of the object 100, and a change of the relative phase, particularly a change in sign of the relative phase, is indicative of a change of direction of rotation of the object 100. The process 570 is used to identify a change of direction of the object 100, which is indicative of a fault condition or a vibration.

The process 570 begins at block 572, where, if an edge is detected in the L_POSCOMP signal, the process 570 proceeds to block 574. At block 574, if a detected direction of movement (sign of phase between R_POSCOMP signal and L_POSCOMP signal) has changed since the last edge of the L_POSCOMP signal, then the process proceeds to block 576.

At block 576, it is determined if a "direction validation edge counter" for both the right and left channels is greater than zero. The direction validation edge counter is reset to zero when there has been a vibration detected in either the right or the left channel. In some embodiments, the direction validation edge counter can be set to one or another value and decremented down to zero. The direction validation edge counter is also described in above-incorporated U.S. Pat. No. 8,446,146.

At block 576, if the L_POSCOMP edge is the first edge, then the process proceeds to block 578. At block 578, it is determined whether the L_POSCOMP signal and the R_POSCOMP signal have both been validated, for example with the process of FIG. 7D. If both are validated, both of the POSCOMP_OK_FLAGS of FIG. 4 will be set. If both are validated, the process proceeds to block 580.

At block 580 it is determined if there is sufficient amplitude in both the right and the left channels. This determination can be made in a variety of ways. In one particular embodiment, differences between the PPEAK signal (158a, FIG. 3) and the NPEAK signal (160a, FIG. 3) can be compared with a predetermined threshold. If at block 580, it is determined that the amplitude of both channels is sufficiently high, the process proceeds to block 582, where the DIR_CHANGE_FLAG signal of FIG. 4 is triggered and the process returns to block 572.

At block 572 if an L_POSCOMP edge is not detected, then the process proceeds to block 584, where, if an edge is detected in the R_POSCOMP signal, the process 570 proceeds to block 586. At block 586, if a detected direction of movement (sign of phase between R_POSCOMP signal and L_POSCOMP signal) has changed since the last edge of the R_POSCOMP signal, then the process proceeds to block 576. If at block 584, there is no R_POSCOMP edge (and no L_POSCOMP edge) then the process 570 proceeds to block 588.

At block 588, it is determined if there has been a combined total of three POSCOMP and POSCOMP_PK edges on one channel without a POSCOMP or POSCOMP_PK edge on the other channel. If this condition is true, then the process proceeds to block 582, where the DIR_CHANGE_FLAG signal is triggered. If this condition is false, then the process 570 returns to block 572. If the conditions of any of the blocks 574-580, 586, or 588 are false, then the process returns to block 572.

Referring now to FIG. 7B, an exemplary process 600 can be performed by the direction change_PK processor 210 of FIG. 4. The process 600 can be carried out for the two channels, right and left, either in series or in parallel. The process 600 is described below with regard to both channels. The process 600 is used to identify a change of direction of the object 100, which is indicative of a fault condition or a vibration.

The process begins at block 602, where, if an edge is detected in the L_POSCOMP_PK signal, the process 600 proceeds to block 604. At block 604, if a detected direction of movement (sign of phase between R_POSCOMP signal and L_POSCOMP signal) has changed since the last edge of the L_POSCOMP_PK signal, then the process 600 proceeds to block 606.

At block 606, it is determined if the "direction validation edge counter" is greater than zero for the channel in which the edge was detected. The direction validation edge counter is also described in above-incorporated U.S. Pat. No. 8,446,146. At block 606, if the direction validation counter (CNT) is greater than zero for the channel in which the edge was detected, then the process 600 proceeds to block 608. At block 608, it is determined whether the POSCOMP_PK signal has been validated (POSCOMP_PK_OK_FLAG set, see FIG. 4) for the channel, right or left, in which the edge was detected at blocks 602 or 604.

At block 610 it is determined if there is sufficient amplitude in both the right and the left channels. This determination can be made in a variety of ways. In one particular embodiment, differences between the PPEAK signal (158a, FIG. 3) and the NPEAK signal (160a, FIG. 3) can be compared with a predetermined threshold. If at block 610, it is determined that the amplitude of both channels is sufficiently high, the process proceeds to block 612, where the DIR_CHANGE_PK_FLAG signal of FIG. 4 is triggered, and the process returns to block 602.

At block 602 if an L_POSCOMP_PK edge is not detected, then the process proceeds to block 614, where, if an edge is detected in the R_POSCOMP_PK signal, the process 600 proceeds to block 616. At block 616, if a detected direction of movement (sign of phase between R_POSCOMP signal and L_POSCOMP signal) has changed since the last edge of the R_POSCOMP_PK signal, then the process proceeds to block 608. If at block 614, there is no R_POSCOMP_PK edge (and no L_POSCOMP_PK edge) then the process 600 returns to block 602. If the conditions of any of the blocks 604-610, 614, 616 are false, then the process returns to block 602.

Referring now to FIG. 7C, an exemplary process 650 can be performed by the direction change_RM (running mode) processor 212 of FIG. 4. The process 650 can be carried out for the two channels, right and left, either in series or in parallel. The process 650 is described below with regard to both channels. The process 650 is used to identify a change of direction of the object 100, which is indicative of a fault condition or a vibration.

The process 650 begins at block 652, where the POSCOMP_PK signal of both the right and the left channel is inspected. If an edge (transition) is detected in the POSCOMP_PK of either the right or the left channel, the process 650 proceeds to block 654. At block 654, an order (right, left) of the last two edges of the POSCOMP signals in the right and left channels (i.e., a phase sign) is compared with an order of the last two edges of the POSCOMP_PK signals in the right and left channels. The last two POSCOMP_PK edges include the one just detected at block 652. If the order is different for the POSCOMP signals than for the POSCOMP_PK signals, then the process proceeds to block 656.

At block 656, if the POSCOMP signals are validated in both the right and left channels, for example, by the process 700 of FIG. 7D, then the process proceeds to block 658 where the DIR_CHANGE_RM_FLAG signal (see FIG. 4) is triggered momentarily, e.g., for one cycle of the clock signal 184a of FIG. 3, and the process returns to block 652. At block 656, if the POSCOMP signals are not validated in both the right and left channels, then the process continues to block 670 where it is determined if the edge count (EDGE_CNT, or referred to as "CHANNEL_CNT" herein) is greater than one. If the edge count is greater than one, then the process continues to block 658. If the edge count is not greater than one, then the process returns to block 652.

At block 652, if an edge is not detected in the POSCOMP_PK signal of either the right or the left channels, then the process proceeds to block 660, where the POSCOMP signals are inspected. If at block 660, a transition is detected in the POSCOMP signal of either the right or the left channel, then the process proceeds to block 662.

At block 662, an order (right, left) of the last two edges of the POSCOMP_PK signals in the right and left channels (i.e., a phase sign) is compared with an order of the last two edges of the POSCOMP signals in the right and left channels. The last two POCOMP edges include the one just detected at block 660. If the order is different for the POSCOMP signals compared to the POSCOMP_PK signals, then the process proceeds to block 664.

At block 664, if the POSCOMP_PK signals are validated in both the right and left channels, then the process continues to block 666. If the POSCOMP_PK signals are not validated in both the right and left channel signals, then the process continues to block 670.

At block 666, it is determined if the states indicated in the STATE_PK state signals of the right and left channels are different. If the states are different, then the process proceeds to block 658. If the states are not different in the two channels, then the process 650 proceeds to block 670. If the conditions of blocks 654, 660, or 662 are not true, then the process returns to block 652.

Referring now to FIG. 7D, an exemplary process 700 can be performed by POSCOMP validation processors 220, 222 of FIG. 4. The process 700 can be carried out for the two channels, right and left, either in series or in parallel. The process 700 is described below with regard to only one channel, but uses the other channel in some of the blocks. The process 700 is used to identify a proper POSCOMP signal. An improper POSCOMP signal can be indicative of a fault or vibration condition.

The process 700 begins at block 702, where it is determined if the signal amplitude of both the right and the left channels (DIFF signal, DDIFF signal, or IDDIFF signal of FIGS. 2 and 3) have sufficient amplitude (or of only one channel in some embodiments). Such a determination is described above in conjunction with block 580 of FIG. 7A. If the amplitude of both the right and the left channels is sufficient, the process 700 proceeds to block 704.

At block 704, it is determined if the motion sensor is presently in the BURP mode of operation. The BURP mode of operation can occur shortly after the motion sensor first receives power and refers to a mode of operation during which the DDIFF signal is moved (e.g., by operation of the AOA/AGC processor 114 and offset and gain adjustment modules 108, 124 (FIG. 2)) to be within a target window near the center of the operating range. The BURP mode is also described in above-incorporated U.S. Pat. No. 8,446,146. If the motion sensor 102 is not presently in the BURP mode of operation, then the process 700 proceeds to block 706.

At block 706, it is determined if the motion sensor 102 is presently in the calibration mode of operation and whether an AOA/AGC event occurs. The calibration mode of operation can occur shortly after the motion sensor 102 is in the BURP mode of operation or at other times. The calibration mode is also described in above-incorporated U.S. Pat. No. 8,446,146. If the motion sensor 102 is not presently in the calibration mode of operation, then the process 700 proceeds to block 708.

A block 708, it is determined if the PEAK_CLAMP_FLAG signal is detected in the channel, right or left, being validated. If the PEAK_CLAMP_FLAG signal is not detected, then the process proceeds to block 710. At block 710, it is determined if the DIR_CHANGE_PK_FLAG signal is detected (set). If the DIR_CHANGE_PK_FLAG signal is not detected, then the process proceeds to block 711. At block 711, it is determined if the DIR_CHANGE_RM_FLAG signal is detected (set). If the DIR_CHANGE_RM_FLAG signal is not detected, then the process proceeds to block 712.

At block 712, it is determined if an edge (transition) of the POSCOMP signal is detected in the channel, right or left, being validated. If the POSCOMP edge is detected, then the process proceeds to block 714. At block 714, it is determined if the states indicated by the right and left channel STATE_PK signals are different. If the indicated states are different, then the process proceeds to block 716, wherein the POSCOMP_OK_FLAG signal is set in the channel, right or left, being validated. Setting of the POSCOMP_OK_FLAG signal is indicative of a validated POSCOMP signal. The process 700 then returns to block 702.

If the condition at block 702 is false or if the conditions of any of the blocks 704-711 are true, then the process 700 proceeds to block 718, where the POSCOMP_OK_FLAG signal is cleared in the channel, right or left, being validated, indicative of a non-validated POSCOMP signal, and then the process 700 returns to block 702. If the condition of block 712 and 714 are false, then the process returns to block 702.

In some embodiments, it may be desirable to enter a vibration mode or a recalibration mode where position information about the object (e.g., object 100 in FIG. 2) is still processed and/or stored upon detection of a vibration. Several conventional techniques are not able to process and/or store position information about an object upon detection of a vibration. In contrast, the techniques herein provide vibration detection with no loss of position information. Moreover, the techniques herein are immune to direction change response, by accounting for a direction change in accordance with the present disclosure.

Figure 8:
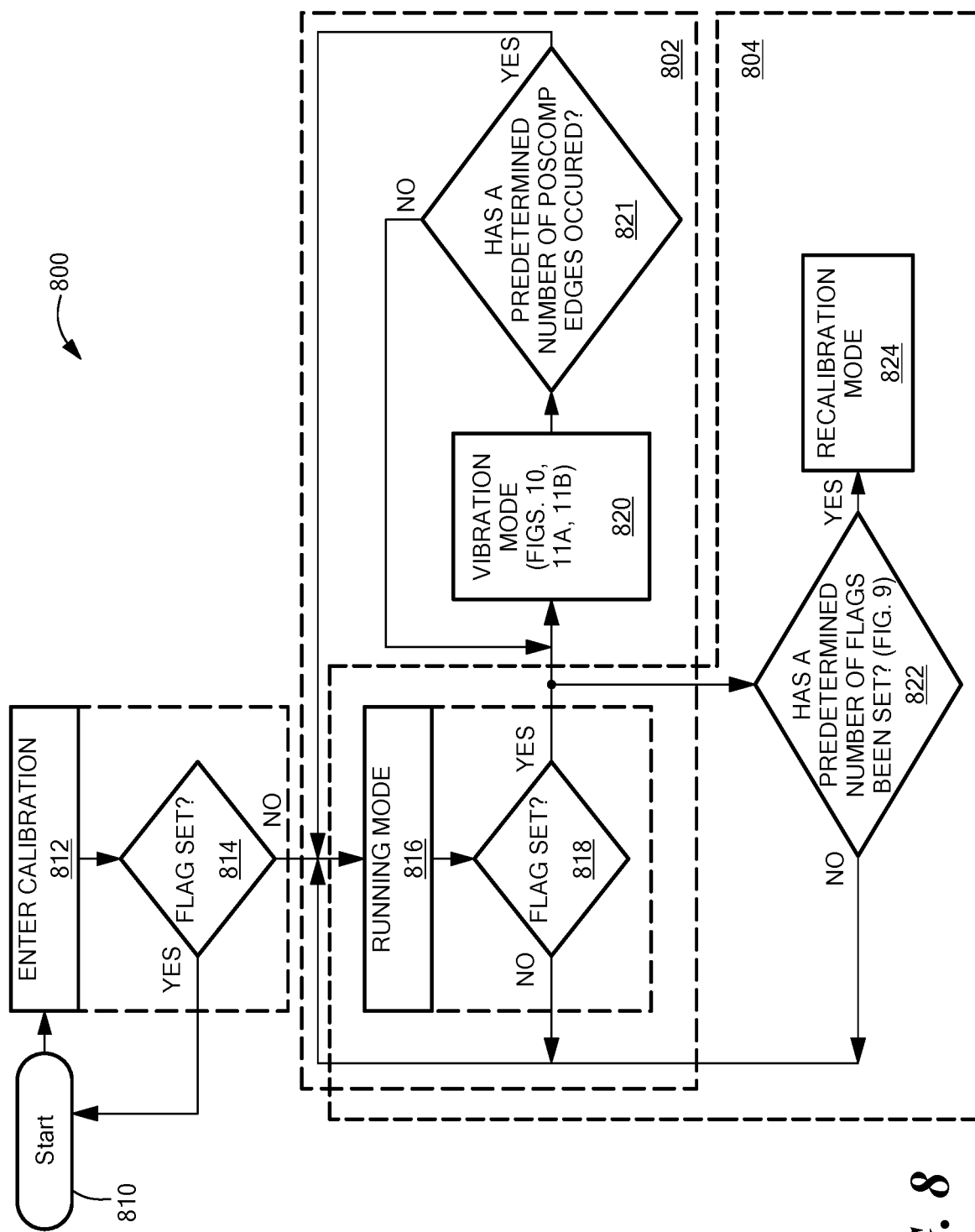
FIG. 8 is a flow chart showing a method for detecting a vibration flag during a running mode of the magnetic field sensor and entering at least one of a vibration mode or a recalibration mode.

Reference is now made to FIG. 8, which is a flow chart showing a method for detecting a vibration flag during a running mode of the magnetic field sensor and entering at least one of a vibration mode or a recalibration mode, in accordance with the present disclosure. The magnetic field sensor is configured to determine a position of the target object (e.g., object 100 in FIG. 2) using a magnetic field signal responsive to magnetic fields generated by the target object that are sensed by a magnetic field sensing element of the magnetic field sensor. In accordance with the present disclosure, the object position information is still received and processed when a vibration of the object is detected, and the object position information is immune to a direction change response.

The method 800 starts at block 810 and enters a calibration mode at block 812 during which, if a flag is set at block 814, the method 800 continues to stay in the calibration mode until no further flags are set. This ensures that the part is operating properly, with no flags being set, prior to entering running mode.

The method 800 then continues to the running mode at block 816, where, if a flag is set at block 818, then the method either proceeds to block 820 and enters a vibration mode, or proceeds to block 822 to determine if a predetermined number of flags have been set. At block 818 it is determined if a vibration flag indicative of a vibration of a target object has been set during a running mode of a magnetic field sensor. As shown, if a flag is set at block 818 during the running mode, the method can either continue to the vibration mode, including the elements 816 and 818 outlined in the dashed-line box 802, or the method can continue to the recalibration mode including the elements 822 and 824 outlined in the dashed-line box 804. It will be appreciated that the method will either select the path of box 802 or the path of box 804 depending upon the particular application for the sensor.

Figure 11A:
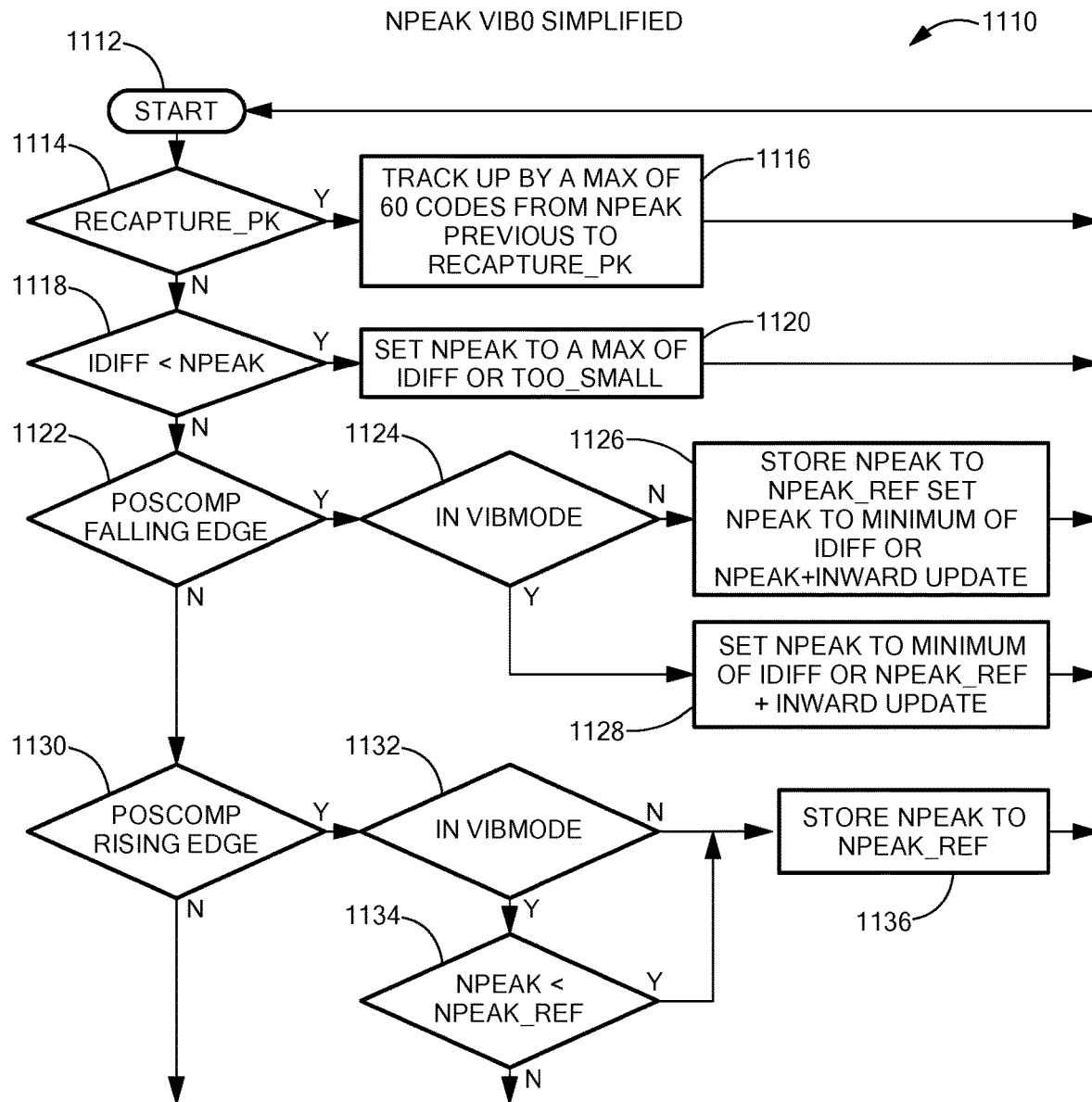
FIG. 11A is a flow chart of a method for the negative peak (or "valley") updating, which can be used for both the vibration mode and the recalibration mode, according to the present disclosure.
Figure 11B:
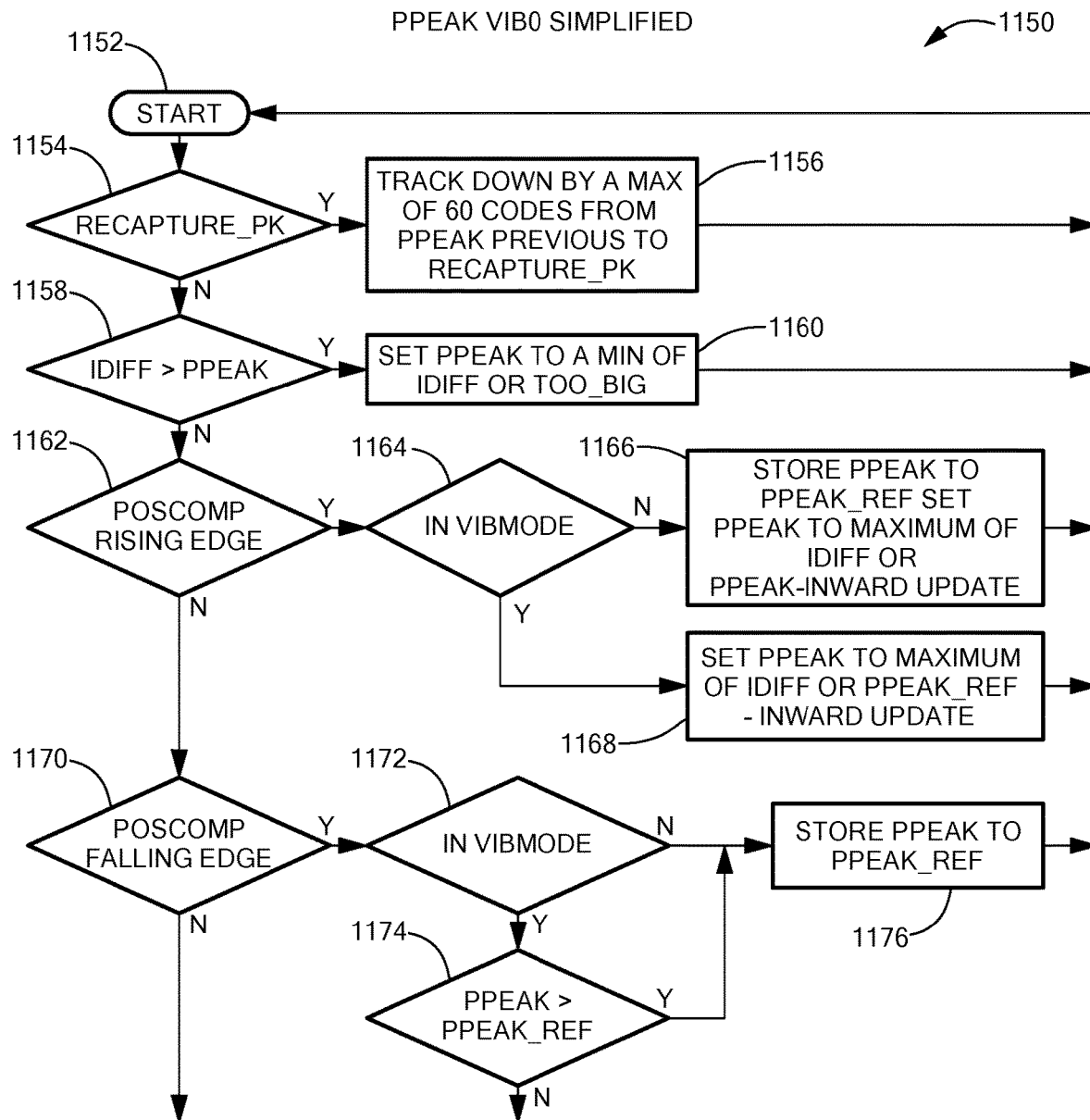
FIG. 11B is a flow chart of a method for the positive peak (or "peak") updating, which can be used for both the vibration mode and the recalibration mode, according to the present disclosure.

If a flag has been set at block 818 during running mode, then the method enters a vibration mode of the magnetic field sensor when the vibration flag has been set. In the vibration mode at block 820, direction information is provided for the target object during the vibration mode of the magnetic field sensor, by holding onto positive peak values and negative peak values of the magnetic field signal during the vibration mode of the magnetic field sensor, and then returning to a running mode of the magnetic field sensor after receiving at least two cycles of the magnetic field signal with no further vibration flags set. The negative peak values can be held during the running mode by allowing downward updating of the negative peak values while restricting upward updating of the negative peak values. Meaning, the negative peak values are allowed to update down to a lower value, but not up to a higher value. The positive peak values can be held by allowing upward updating of the positive peak values while restricting downward updating of the positive peak values. Meaning, the positive peak values are allowed to update up to a higher value, but not down to a lower value. The amount to which the positive peak values and negative peak values are allowed to update can be a fixed number or a percentage of the previous value. Refer to FIGS. 11A and 11B for details for the positive peak and negative peak updating, in accordance with the present disclosure.

The method 800 remains in the vibration mode until, at block 821, the method determines that a predetermined number of POSCOMP edges have occurred. If the predetermined number of POSCOMP edges have occurred at block 821, then the method returns to the running mode at block 816. If the predetermined number of POSCOMP edges have not occurred, then the method continues to stay in the vibration mode.

In some embodiments, when a vibration flag has been set (i.e., triggered), rather than entering a vibration mode, the method can continue to remain in the running mode until a predetermined number of flags have been set at block 822. If a predetermined number of flags have been set, then the system enters a recalibration mode at block 824. If the predetermined number of flags have not been set, the method returns to the running mode at block 816. This allows up to a predetermined number of flags to be set (i.e., to "go off" or otherwise be triggered during running mode) which is expected of a direction change, without determining that an actual vibration has occurred until the predetermined number of flags have been set. Thus, once the predetermined number of flags have been set, the sensor enters a recalibration mode at block 824. This can be the same as, or similar to, calibration mode 812, where the sensor ensures it is operating properly prior to returning to the running mode. The positive peak values and negative peak values are treated the same as though they are in running mode while the method determines if the number of flags have been set at block 822 by the positive and negative peak updating, shown and described herein with reference to FIGS. 11A and 11B.

At block 822, a counter can be implemented for each of a plurality of vibration flags to determine if the predetermined number of vibration flags have been set. Refer, for example, to FIGS. 9A-9G showing example flag counters for the recalibration mode. The vibration flags can comprise at least one of an inflection flag, a peak in flag, a peak clamp flag, a phase too close flag, a direction change flag, a direction change peak flag, or a direction change running mode (rm) flag.

FIGS. 9A-9G are flow charts showing a method for determining if a predetermined number of flags have been set upon detecting at least one vibration flag, according to the present disclosure. According to the present disclosure, the method assumes that a certain number of flags will likely change after a certain event, such as a direction change, and thus that the system should not recalibrate until at least a predetermined number of flags have been set without having any interruption of information. For example, an inflection flag would need to trigger for a predetermine number of times (such as three rising edges) before the system enters a recalibration mode. In other embodiments, the different types of flags can determine entry into the recalibration mode, for example if an inflection flag, a direction change flag, and a direction change peak flag would all need to be set in order to enter the recalibration mode. It will be appreciated that, although shown and described as a single flag being set a predetermined number of times, the techniques are likewise applicable to a number of different flags being set, and is highly variable. Once the predetermined number of flags are set, this indicates the object is definitely vibrating, and the sensor needs to enter a recalibration mode. It is important to retain the information obtained prior to the predetermined number of flags being set, rather than discarding the information according to conventional techniques, so that this information is not lost until the predetermined number of flags have been set.

Figure 9A:
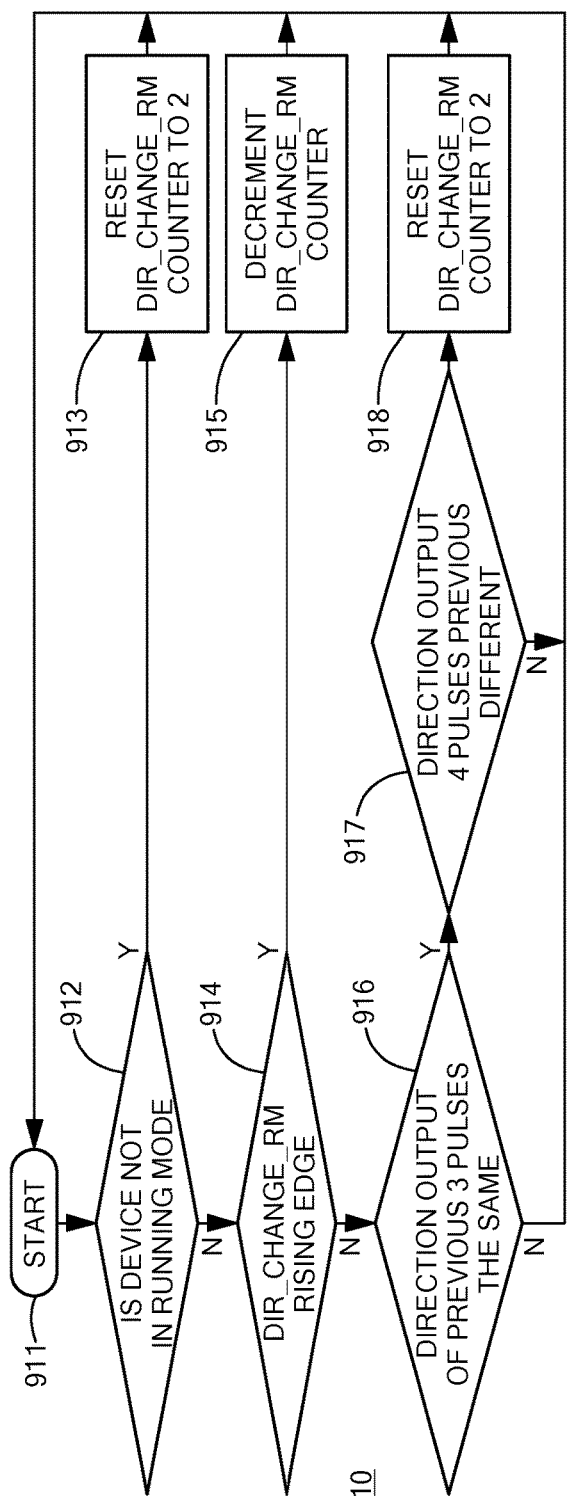
Figure 9B:
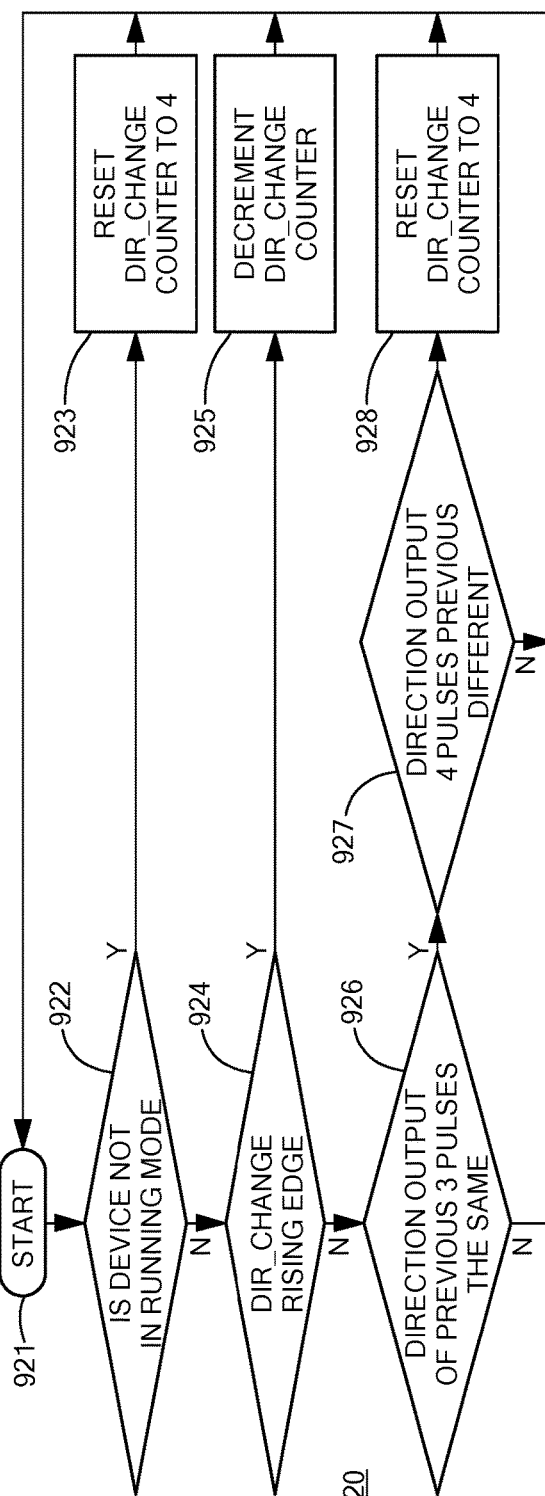
Figure 9E:
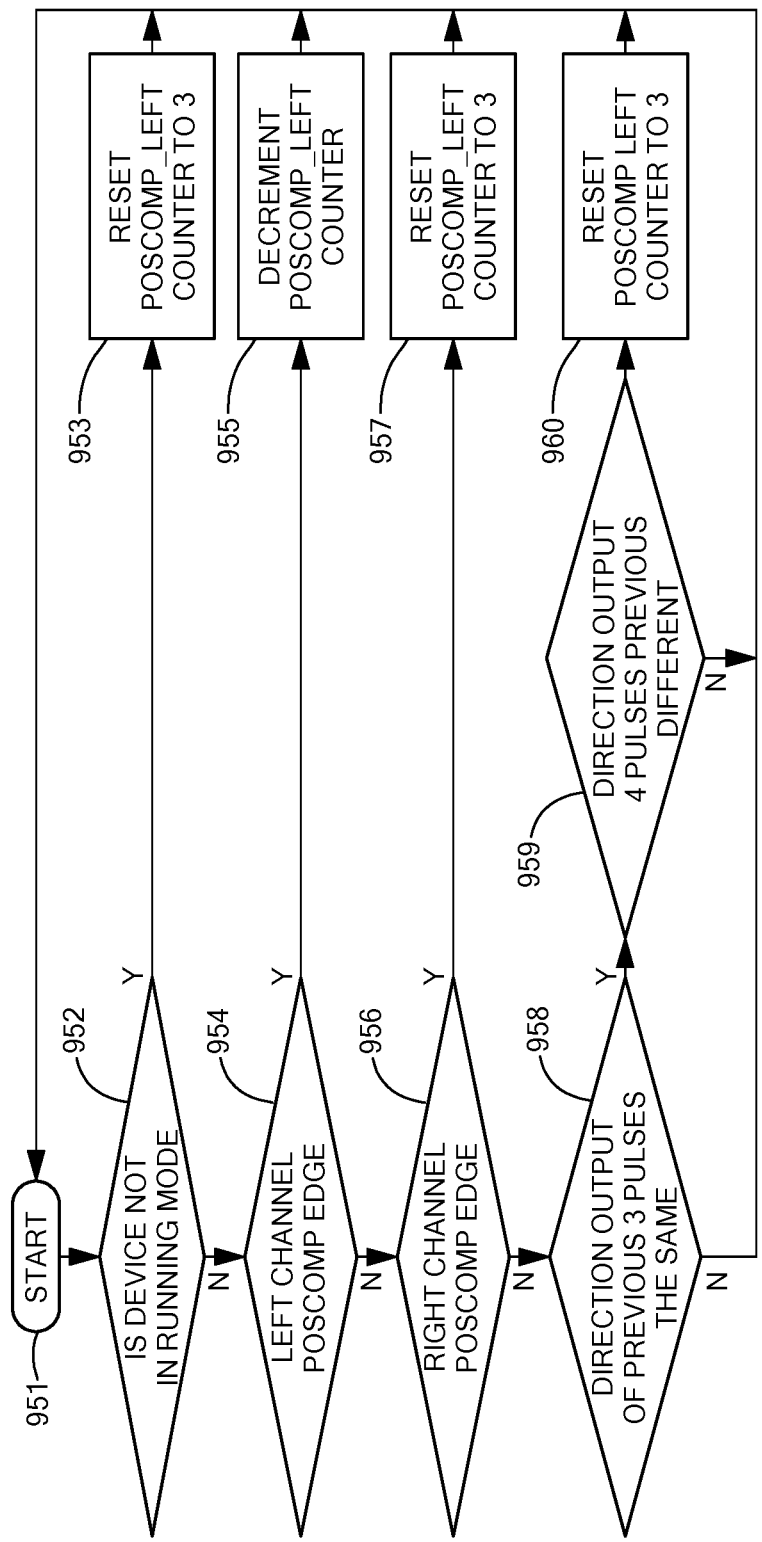
Figure 9F:
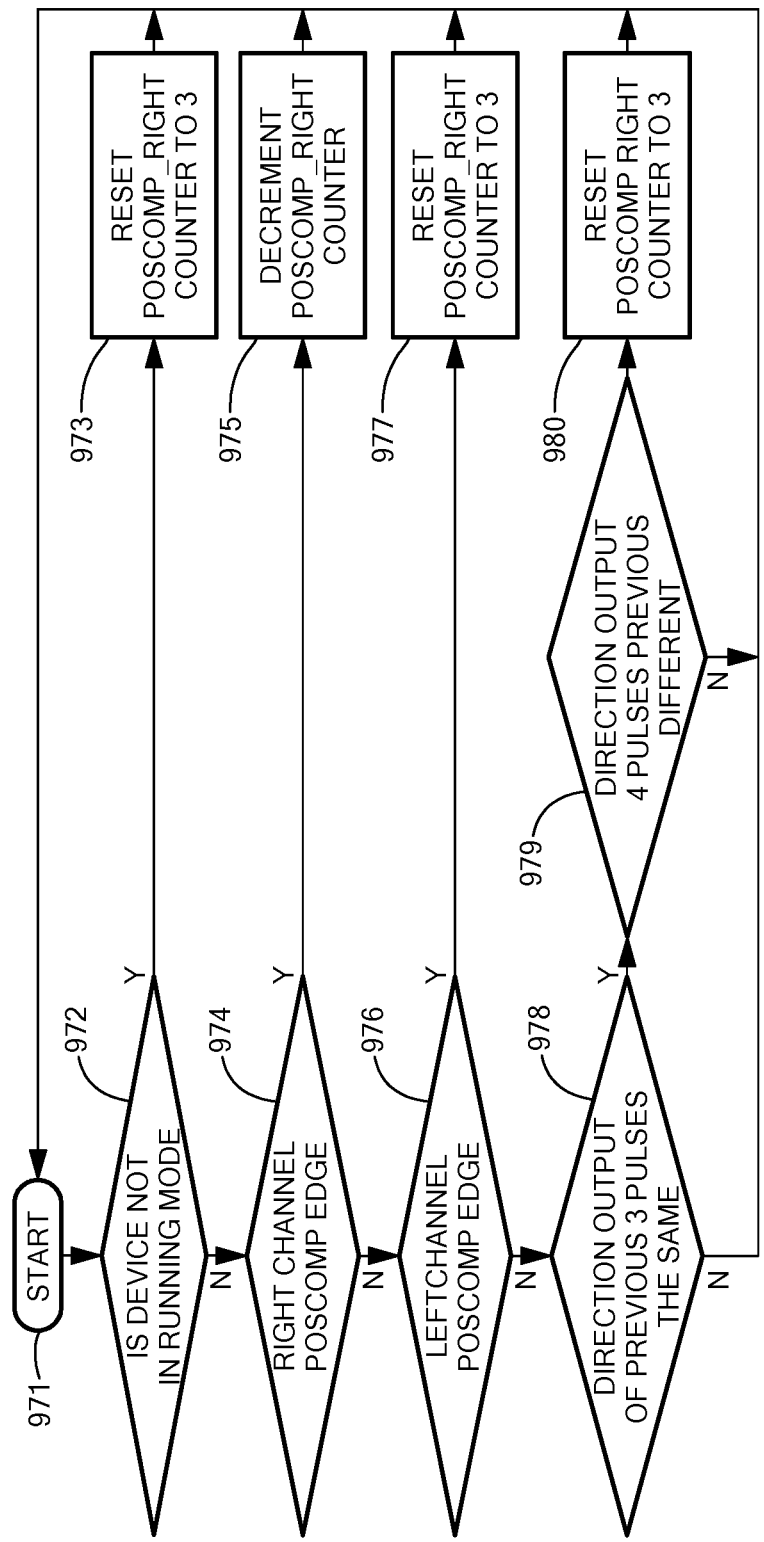

As shown in FIGS. 9A-9G, there are flag counter flow charts 910 in FIG. 9A, 920 in FIG. 9B, 930 in FIG. 9C, 940 in FIG. 9D, 950 in FIG. 9E, and 970 in FIG. 9F, with an overall flow chart 990 in FIG. 9G for setting the vibration flag in the recalibration mode. As shown in FIG. 9G, the method 990 commences at START and continues to block 992.

At block 992, the method determines if the DIR_CHANGE_RM (direction change running mode) flag counter is at zero (0). Refer, for example, to FIG. 7C showing an example DIR_CHANGE_RM flag processing. If the counter is at zero (meaning that the flag has been triggered at least three times as shown in the flow diagram 910), then the method sets a vibration flag at block 998. If the counter is not zero, the method continues to block 993. Flow diagram 910 in FIG. 9A shows the counter for the DIR_CHANGE_RM flag to determine if the counter is at zero at block 992. Flow diagram 910 starts at block 911. At block 912, it is determined if the device is not in running mode. If the device is not in running mode, then the DIR_CHANGE_RM counter is reset to two (2) at block 913. If the device is in running mode, then the DIR_CHANGE_RM rising edge at block 914, the DIR_CHANGE_RM counter is decremented at block 915. When the direction output of three previous pulses are the same at block 916 (i.e. from the output of output protocol processor 118 in FIG. 1), then the method determines if the direction output of the four previous pulses are different. At block 917, the method determines. If they are not different, the method returns to the start. If the direction output is different, then the direction output of four pulses are checked at block 917 to determine if the fourth pulse is different. If the fourth pulse is not different, the method returns to start. If the fourth pule is different, then the DIR_CHANGE_RM counter is reset to two (2) at block 918, so that the counter still does not return to zero, meaning it should remain in the running mode. It will be appreciated that the terms DIR_CHANGE_RM and DIR_CHANGE_RM_FLAG refer to the same flag and may be used interchangeably herein.

At block 993, the method determines if the DIR_CHANGE (direction change) flag counter is at zero (0). Refer, for example, to FIG. 7A showing an example DIR_CHANGE processing. If the counter is at zero (meaning the flag has triggered for at least three times as shown in the flow diagram 920), then the method sets a vibration flag at block 998. If the counter at block 993 is not zero, the method continues to block 994. Flow diagram 920 in FIG. 9B shows the counter for the DIR_CHANGE flag to determine if the counter is at zero at block 993. Flow diagram 920 starts at block 921 and then proceeds to block 922. At block 922, the method determines if the device is not in running mode. If the device is not in running mode, at block 923 the DIR_CHANGE counter is reset to four (4). If the device is in running mode at block 922, then at block 924 each DIR_CHANGE rising edge, the DIR_CHANGE counter is decremented at block 925. Once the counter reaches zero, the vibration flag will be set. When the direction output of the previous three pulses is the same at block 926 (i.e. the output from processor 118), a check is made to determine if the direction output of four pulses is different. If the direction output is different at 927, then the DIR_CHANGE counter is reset to four at block 928. It will be appreciated that the terms DIR_CHANGE and DIR_CHANGE_FLAG refer to the same flag and may be used interchangeably herein.

At block 994, the method determines if the DIR_CHANGE_PK (direction change peak) flag counter is at zero (0). Refer, for example, to FIG. 7B showing an example DIR_CHANGE_PK processing. If the counter is at zero (meaning the flag has been set for at least three counts upon rising edge of the vibration flag, triggers the clock cycle it reaches three times vibration flag is triggered as shown in the flow diagram 930), then the method sets a vibration flag at block 998. If the counter at block 994 is not zero, the method continues to block 995. Refer to flow diagram 930 in FIG. 9C showing the counter for the DIR_CHANGE_PK flag to determine if the counter is zero at block 994. Flow diagram 930 starts at block 931. At block 932, the method determines if the device is not in running mode. If the device is not in running mode, the DIR_CHANGE_PK counter is reset to two (2) at 933. If the device is in running mode, at 934 at each DIR_CHANGE_PK rising edge the DIR_CHANGE_PK counter is decremented at 935. When the direction output of the three previous pulses are the same at block 936, the method continues to 937 to determine if the direction output of the four previous pulses are different. If the direction output of the four previous pulses are different at block 937, then the counter for DIR_CHANGE_PK is reset to two (2) at block 938. It will be appreciated that the terms DIR_CHANGE_PK and DIR_CHANGE_PK_FLAG refer to the same flag and may be used interchangeably herein.

At block 995, the method determines if the INFLECTION flag counter is at zero (0). Refer, for example, to FIG. 7 showing an example INFLECTION processing. If the counter is zero (meaning the flag has triggered at least three times as shown in the flow diagram 940 in FIG. 9D), then the method sets a vibration flag at block 998. If the counter at block 995 is not zero, the method continues to block 996. Refer to flow diagram 940 in FIG. 9D, showing the counter for the INFLECTION flag to determine if the counter is zero at block 995. Flow diagram 940 starts at block 941. At block 942, the method determines if the device is not in running mode. If the device is not in running mode, at block 943 the inflection flag counter is reset to three (3). If the device is in running mode, at block 944, each inflection flag rising edge the inflection counter is decremented at block 945. When the direction output of the previous three pulses are the same at block 946, the method checks to determine if the direction output of the four previous pulses are different at block 947. If the four previous pulses are different at block 947, the inflection counter is reset to three (3) at block 948. If the four previous pulses are not different (i.e., are the same) at block 947, the method returns to start at block 941. It will be appreciated that the terms INFLECTION, INFLECTION_FLAG, L_INFLECTION_FLAG and R_INFLECTION_FLAG refer to the same flag and may be used interchangeably herein. In some cases, "INFLECTION" may refer to INFLECTION_FLAG L, INFLECTION_FLAG R, or a combination of both.

At block 996, the method determines if the POSCOMP_RIGHT (right channel detector output) counter is at zero (0). Refer, for example, to FIG. 7D showing an example switch point crossing. If the counter is at zero (meaning the flag has triggered at least three times as shown in the flow diagram 970), then the method sets a vibration flag at block 998. If the counter at block 996 is not zero, the method continues to block 997.

Refer to FIG. 9F showing flow diagram 970, the counter for the right channel state transition at block 996. Flow diagram 970 starts at block 971 and continues to block 972. At block 972, the method determines if the device is not in running mode. If the device is not in running mode, at block 973 the POSCOMP_RIGHT counter is reset to three (3). If the device is in running mode, at 974 each right channel POSCOMP edge the POSCOMP_RIGHT counter is decremented at 975. At 976, each left channel POSCOMP edge the POSCOMP_RIGHT counter is reset to three (3) at 977.

When the direction output of the previous three pulses are the same at 978, the method checks to determine if the direction output of the four previous pulses are different. If the direction output of the four previous pulses are different at block 979, then the counter for POSCOMP_RIGHT is reset to three (3) at block 980.

At block 997, the method determines if the POSCOMP_LEFT (left channel detector output) counter is at zero (0). Refer, for example, to FIG. 7D showing an example switch point crossing. If the counter is at zero (meaning the flag triggered at least three times as shown in the flow diagram 950 in FIG. 9E), then the method sets a vibration flag at block 998. If the counter is not at zero, the method returns to start. Refer to flow diagram 950 in FIG. 9E showing the counter for the left channel state transition at block 997. Flow diagram 950 starts at block 951 and continues to block 952. At block 952, the method determines if the device is not in running mode. If the device is not in running mode, at block 953 the POSCOMP_LEFT counter is reset to three (3). If the device is in running mode, at block 954 each left channel POSCOMP edge the POSCOMP_LEFT counter is decremented at block 955. At block 956 each right channel POSCOMP edge the POSCOMP_LEFT counter is set to three (3) at block 957. When the direction output of the previous three pulses are the same at block 958, the method checks to determine if the direction output of the four previous pulses are different at block 959. If the four previous pulses are different at block 959, the inflection counter is reset to three (3) at block 960. If the four previous pulses are not different (i.e., are the same) at block 959, the method returns to start at block 951.

Figure 10:
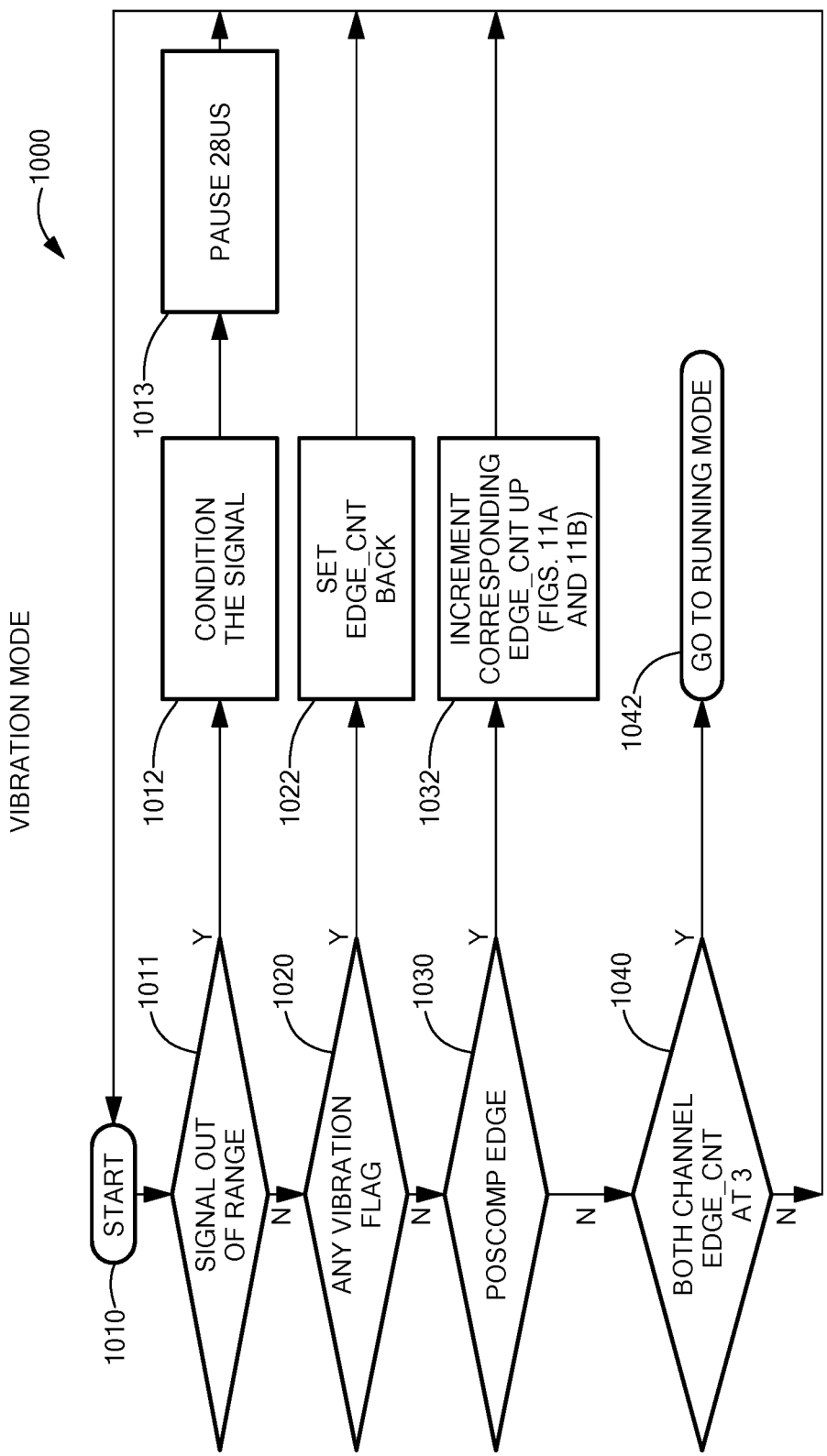
FIG. 10 is a flow chart showing a method for the vibration mode upon detecting a vibration flag.

FIG. 10 is a flow chart showing a method for the vibration mode upon detecting a vibration flag and can, for example, correspond to blocks 820 and 821 in FIG. 8. The vibration mode is intended to ensure that there is no further vibration occurring before returning to the running mode for the magnetic field sensor. At each POSCOMP edge, a counter is incremented, and as long as no vibration flags are set for at least three edges of POSCOMP (i.e., at least three clock cycles), then the method returns to the running mode. This ensures that if any vibration flags are set, the counter is reset so that the method validates that at least three POSCOMP edges (per channel) have been received prior to returning to the running mode. The number of edges is selected as three in this example, for example, if the object is a toothed-gear, to ensure that there is at least a two-tooth-long validation that there are no further vibration flags set before returning to the running mode. Any number can be selected for the counter to provide the desired time of validation before returning to the running mode.

More particularly, the method 1000 for the vibration mode starts at block 1010 and continues to block 1011. At block 1011, the method determines if the incoming signal is out of range. If the signal is out of range, the signal is conditioned at block 1012, and then there is a 28 microsecond pause at block 1013, and the method then continues to the start art block 1010. If the signal is not out of range at block 1011, then the method continues to block 1020.

At block 1020, the method determines if any vibration flag has been set. If any vibration flag has been set, then the CHANNEL_CNT or EDGE_CNT counter is set back to zero at block 1022, and the method returns to the start at block 1010. The counter is set to zero so that if any new vibration flag is set, this resets the counter to ensure the desired length of validation prior to returning to running mode. It will be appreciated that although the counter is set to zero and then incremented to a certain number to achieve the functionality herein, it can likewise be set to a specific number and then decremented down to zero. It will be appreciated that the vibration flag at block 1020 can be any vibration flag described herein, including but not limited to an inflection flag (INFLECTION, R_INFLECTION_FLAG, OR L_INFLECTION_FLAG), a peak in flag, a peak clamp flag, a phase too close flag, a direction change flag (DIR_CHANGE or DIR_CHANGE_FLAG), a direction change peak flag (DIR_CHANGE_PEAK or DIR_CHANGE_PEAK_FLAG), or a direction change running mode (rm) flag (DIR_CHANGE_RM or DIR_CHANGE_RM_FLAG). If no vibration flag has been set at block 1020, the method continues to block 1030.

At 1030, when a POSCOMP edge is received, the corresponding EDGE_CNT is incremented upward at block 1030. For example, if the POSCOMP edge is for the left channel, the left channel EDGE_CNT is incremented and likewise, if the POSCOMP edge is for the right channel, the right channel EDGE_CNT is incremented. The method returns to the start at block 1010 after the EDGE_CNT is incremented at block 1032.

At block 1040, if the channel EDGE_CNT for both the left channel and the right channel are at three (3), then the method advances to block 1042 and returns to the running mode. If the channel EDGE_CNT is not three (3) for both the left channel and the right channel, the method returns to the start at block 1010. By doing so, once there are three edges of POSCOMP (i.e. 1.5 magnetic field signal cycles per channel) of the signal received without further vibration flags being set, this allows the sensor to return to the running mode. This further allows the position information to be maintained by holding onto the values and controlling the updating of the peak values, as described in greater detail herein with reference to FIGS. 11A and 11B. It will be appreciated that, although the EDGE_CNT is set to three (3) in FIG. 9, this number is highly variable and in some instances it could be four or more, to verify that the correct number of teeth (or other identifying feature of an object) have passed without the need for further validation. Selecting a value of three ensures a validation that is at least as long as two teeth of the gear (e.g., object 100 of FIG. 2).

Reference is now made to FIGS. 11A and 11B showing, respectively, methods for negative peak updating and positive peak updating, according to the present disclosure. FIG. 11A is a flow chart of a method for the negative peak (or "valley") updating, which can be used for both the vibration mode and the recalibration mode, according to the present disclosure. FIG. 11B is a flow chart of a method for the positive peak (or "peak") updating, which can be used for both the vibration mode and the recalibration mode, according to the present disclosure. These updating schemes allow the position information for the target object (e.g., object 100 in FIG. 2) to be retained or otherwise held onto during the vibration mode (for example, shown in FIG. 10) or during the recalibration mode (for example, shown in FIG. 9).

FIG. 11A is a flow chart of a method for the negative peak (or "valley") updating, according to the present disclosure. The method 1110 starts at block 1112 and continues to block 1114. At block 1114, the method tries to recapture the peak value RECAPTURE_PK to determine if it is active. If the peak can be recaptured, then at block 1116 the previous negative peak ("NPEAK") is tracked up by a maximum of 60 codes to RECAPTURE_PK. For example, the AOA/AGC processor 114 can create a flag (RECAPTURE) upon an event and the step size is a maximum of 60 codes on DDIFF.

If the recaptured NPEAK signal is not active at block 1114, the method continues to block 1118. The method determines at block 1118 if IDIFF is less than the NPEAK value. IDIFF can be, for example, L_DIFF or R_DIFF shown in FIG. 2, and may also be DDIFF described herein, which is any differential measurement from the amplifier for either the left channel or the right channel. If IDIFF is less than NPEAK, then NPEAK is set to be a maximum of IDIFF or "TOO_SMALL." TOO_SMALL is an arbitrary value assigned to NPEAK that is a value that is too small, which for example can be 96 codes, which is an arbitrary unit of Volts). If IDIFF is not less than NPEAK at block 1118, the method continues to block 1122.

At block 1122, at each POSCOMP falling edge, the method continues to block 1124. If the sensor is in vibration mode at block 1124, then the NPEAK is set to the minimum of IDIFF or the NPEAK, and inward update at block 1128. If the sensor is not in vibration mode at block 1124, then the NPEAK value is stored to NPEAK_REF, and the NPEAK is set to the minimum of IDIFF or NPEAK_REF and inward update is limited by 25% of the peak-to-peak value at block 1126. Meaning, NPEAK is allowed to update upwardly to a higher value, but not downwardly to a lower value. The "inward update" is a variable dependent upon the mode of operation of the sensor. If the sensor is in recalibration or vibration mode, then the inward update is 12.5%, however if the sensor is in running mode, the amount by which the updating is limited is 25%.

At block 1130, at each POSCOMP rising edge, the method continues to block 1132. If the sensor is not in vibration mode at block 1132, the sensor stores the NPEAK to the NPEAK_REF at block 1136 and returns to the start at block 1112. If the sensor is in vibration mode at block 1132, and the NPEAK is less than the NPEAK_REF, then the method continues to block 1136. If the sensor is in vibration mode at block 1132 and the NPEAK is not less than NPEAK_REF, the method returns to the start at block 1112.

FIG. 11B is a flow chart of a method for the positive peak (or "PPEAK") updating, according to the present disclosure. The method 1150 starts at block 1152 and continues to block 1154. At block 1154, the method tries to recapture the peak value RECAPTURE_PK to determine if it is active. If the peak can be recaptured, then at block 1156 the previous positive peak ("PPEAK") is tracked down by a maximum of 60 codes to RECAPTURE_PK. RECAPTURE_PK is a flag when an AOA event occurs (e.g., at the AOA/AGC processor 114 in FIG. 2). This provides a way to adjust PPEAK or NPEAK when purposely injecting a signal on top of the magnetic field signal.

If the RECAPTURE_PK signal is not active, the method continues to block 1158. The method determines at block 1158 if IDIFF is greater than the PPEAK value. IDIFF is, for example, L_DIFF or R_DIFF shown in FIG. 2, and may also be DDIFF described herein, which is any differential measurement from the amplifier for either the left channel or the right channel. If IDIFF is greater than PPEAK, then PPEAK is set to a minimum of IDIFF or TOO_BIG. "TOO_BIG" is an arbitrary value determined prior to running mode that is selected to be a value that is considered too large for PPEAK, which for example may be 416 codes or arbitrary units of Volt, such as 2 mV/code. If IDIFF is not greater than PPEAK at block 1158, the method continues to block 1162.

At block 1162, at each POSCOMP rising edge, the method continues to block 1164. If the sensor is not in vibration mode at block 1164, then the PPEAK is stored to PPEAK_REF at block 1166, and the PPEAK is set to a maximum of IDIFF or PPEAK, and inward update. If the sensor is in vibration mode at block 1164, then the method continues to block 1168 where the PPEAK is set to maximum of IDIFF or PPEAK, and inward update.

At block 1170, at each POSCOMP falling edge, the method continues to block 1172 to determine if the sensor is in vibration mode. If the sensor is not in vibration mode at block 1172, the sensor stores the PPEAK value to PPEAK_REF at block 1176. If the sensor is in vibration mode at block 1172, but the PPEAK is greater than PPEAK_REF at block 1174, then the method continues to block 1176 and stores PPEAK to PPEAK_REF. If the PPEAK is not greater than PPEAK_REF at block 1174, the method then returns to the start at block 1152.

Figure 12:
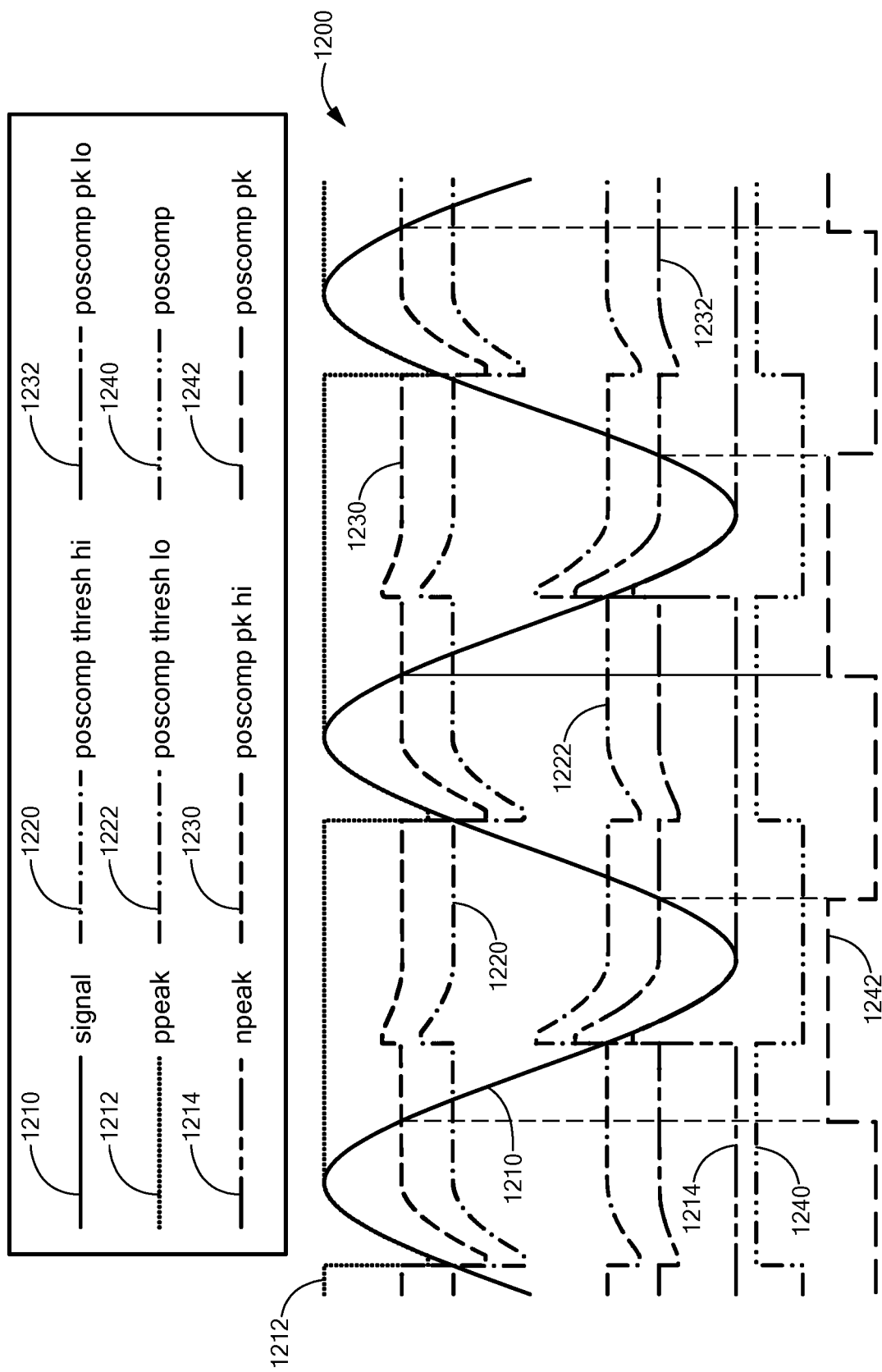
FIG. 12 is a graph showing the various waveforms for a single channel, and illustrating the threshold updating, according to the present disclosure.

FIG. 12 is a graph showing the various waveforms for a single channel (left channel or right channel), and illustrating the threshold updating, according to the present disclosure. The graphical diagram 1200 includes various waveforms, including the incoming magnetic field signal 1210, a PPEAK signal 1212, NPEAK signal 1214, POSCOMP threshold hi 1220, POSCOMP threshold lo 1222, POSCOMP peak hi 1230, and POSCOMP peak lo 1232. The differential signals POSCOMP 1240 and POSCOMP PK 1242 are also shown in FIG. 12. The graph 1200 shows time in arbitrary units of time along the X-axis and amplitude in arbitrary units of amplitude along the Y-axis. The incoming signal 1210 can, for example, be L_POSCOMP or R_POSCOMP shown in FIG. 2, or POSCOMP shown in FIG. 3. The PPEAK 1212 can be R_PPEAK or L_PPEAK shown in FIG. 2. The NPEAK 1214 can be the R_NPEAK or L_NPEAK shown in FIG. 2. The POSCOMP THRESH HI 1220 can be THRESH_A in FIG. 2, and the POSCOMP THRESH LO 1222 can be THRESH_B in FIG. 2. POSCOMP PK HI can correspond to block 454 in FIG. 7, and POSCOMP PK LO can correspond to block 462 in FIG. 7, which are both generated by the vibration processor, for example 116 in FIG. 2.

As shown in FIG. 12, note that the thresholds 1220 and 1222 change as the NPEAK and PPEAK values change. The POSCOMP signal 1240 provides a waveform that indicates every time the signal 1210 is approaching a peak value of the signal 1210. At the rising edge of the signal, POSCOMP rises to a logical 1, and at the falling edge of the signal, POSCOMP falls to a logical 0. The POSCOMP PK signal 1242 provides a waveform that indicates every time the signal 1210 is leaving a peak value. When leaving a high peak, the POSCOMP PK 1242 transitions to a logical 1, and when leaving a low peak, the POSCOMP PK 1242 transitions to a logical 0, thus providing the waveforms as shown. As shown, the PPEAK value updates on the rising edge of the signal 1210 and the NPEAK value updates on the falling edge of the signal 1210.

At the moment when the NPEAK value changes, the previous value is stored into NPEAK_REF. Likewise, when PPEAK value changes, the previous value is stored into PPEAK_REF. Refer to FIGS. 11A and 11B for flow charts for storing and updating the PPEAK and NPEAK values, according to the present disclosure.

Note that the thresholds 1220 and 1222 change as PPEAK and NPEAK change. For example, as PPEAK 1212 drops, note that the threshold 1220 also drops. Similarly, as NPEAK 1214 rises, note that the threshold 1222 also rises. Every clock cycle, the threshold gets calculated depending upon the values of NPEAK and PPEAK. Thus, the threshold is updated every time that NPEAK updates.

Note that the rising edge of the POSCOMP signal 1240 corresponds to the falling edge of the PPEAK signal, and that the falling edge of the POSCOMP signal 1240 corresponds to the rising edge of the NPEAK SIGNAL. Also note that the rising edge of the POSCOMP signal 1240 corresponds to the signal 1210 crossing the high threshold 1220, and that the falling edge of POSCOMP signal 1240 corresponds to the signal 1210 crossing the low threshold 1222.

It will be appreciated that this is only one example set of waveforms that can result from an incoming magnetic field signal. Similarly, these waveforms are for only a single channel (left or right). Further, the thresholds are based on predetermined values and are highly variable depending upon the particular application for the magnetic field sensor.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A method of detecting a vibration of a target object with a magnetic field sensor, the method comprising:
   generating one or more detector output signals having state transitions at times determined by applying a threshold to a magnetic field signal generated by one or more magnetic field sensing elements of the magnetic field sensor in response to a magnetic field affected by the target object;
   determining a vibration flag indicative of a vibration of the target object has been set during a running mode of the magnetic field sensor;
   entering a vibration mode of the magnetic field sensor when the vibration flag has been set;
   holding positive peak values and negative peak values of the magnetic field signal during the vibration mode of the magnetic field sensor;
   providing direction information for the target object during the vibration mode of the magnetic field sensor based on the one or more detector output signals; and
   returning to a running mode of the magnetic field sensor after a predetermined number of state transitions of the one or more detector output signals with no further vibration flags set.

2. The method of claim 1, wherein holding the positive peak values and the negative peak values comprises allowing outward updating of the positive peak values and the negative peak values while restricting inward updating of the positive peak values and the negative peak values during the vibration mode.

3. The method of claim 1, wherein the vibration flag comprises at least one of: an inflection flag, a peak in flag, a peak clamp flag, a phase too close flag, a direction change flag, a direction change peak flag, or a direction change running mode (rm) flag.

4. The method of claim 1, wherein an edge counter is incremented after each state transition of the one or more detector output signals.

5. The method of claim 4, wherein the positive peak values update on a rising edge of the state transitions of the one or more detector output signals.

6. The method of claim 4, wherein the negative peak values update on a falling edge of the state transitions of the one or more detector output signals.

7. The method of claim 4, wherein the determined vibration flag comprises a first vibration flag and wherein the edge counter is reset to zero if a second vibration flag indicative of a vibration of the target object is set.

8. The method of claim 1, wherein the threshold is based on the positive peak values and negative peak values.

9. A method of detecting a vibration of a target object with a magnetic field sensor, the method comprising:
   generating one or more detector output signals having state transitions at times determined by applying a threshold to a magnetic field signal generated by one or more magnetic field sensing elements of the magnetic field sensor in response to a magnetic field affected by the target object;
   determining a vibration flag indicative of a vibration of the target object has been set during a running mode of a magnetic field sensor;
   entering a vibration mode in response to the vibration flag determination, wherein the vibration mode comprises providing direction information for the target object; and
   returning to the running mode of the magnetic field sensor after a predetermined number of state transitions of the one or more detector output signals with no vibration flags set.

10. The method of claim 9, wherein the vibration mode comprises holding positive peak values and negative peak values of the magnetic field signal.

11. The method of claim 10, wherein the vibration mode further comprises allowing inward updating of the positive peak values and the negative peak values while restricting outward updating of the positive and negative peak values.

12. The method of claim 9, wherein the vibration flag comprises at least one of: an inflection flag, a peak in flag, a peak clamp flag, a phase too close flag, a direction change flag, a direction change peak flag, or a direction change running mode (rm) flag.

13. The method of claim 9, wherein an edge counter is incremented after each state transition of the one or more detector output signals.

14. The method of claim 13, wherein the positive peak values update on the rising edge of the state transitions of the one or more detector output signals and the negative peak values update on the falling edge of the state transitions of the one or more detector output signals.

15. A method of detecting vibration of a target object with a magnetic field sensor, the method comprising:
   generating one or more detector output signals having state transitions at times determined by applying a threshold to a magnetic field signal generated by one or more magnetic field sensing elements of the magnetic field sensor in response to a magnetic field affected by the target object;
   providing direction information for the target object during a vibration mode of a magnetic field sensor based on the one or more detector output signals;
   allowing outward updating of positive peak values and negative peak values of the magnetic field signal during the vibration mode while restricting inward updating of the positive peak values and the negative peak values; and
   generating the threshold based on the positive peak values and the negative peak values of the magnetic field signal.

16. The method of claim 15, further comprising entering the vibration mode based on a determination that a vibration flag indicative of a vibration of the target object has been set, wherein the vibration flag comprises at least one of: an inflection flag, a peak in flag, a peak clamp flag, a phase too close flag, a direction change flag, a direction change peak flag, or a direction change running mode (rm) flag.

17. The method of claim 15, wherein an edge counter is incremented after each state transition of the one or more detector output signals.

18. The method of claim 17, wherein the positive peak values update on a rising edge of the state transitions of the one or more detector output signals and the negative peak values update on a falling edge of the state transitions of the one or more detector output signals.

\* \* \* \* \*

UNITED STATES PATENT AND TRADEMARK OFFICE
CERTIFICATE OF CORRECTION

PATENT NO. : 11,029,176 B2  
APPLICATION NO. : 16/404981  
DATED : June 8, 2021  
INVENTOR(S) : Benjamin Geiger et al.

Page 1 of 2

It is certified that error appears in the above--identified patent and that said Letters Patent is hereby corrected as shown below:

In the Specification

Column 8, Line 41 delete "signals" and replace with --signal--.

Column 8, Line 58 delete "motions" and replace with --motion--.

Column 8, Line 59 delete "rotations)" and replace with --rotation)--.

Column 11, Line 29 delete "vibration the" and replace with --vibration of the--.

Column 12, Lines 50-51 delete ", respectfully," and replace with --, respectively,--.

Column 12, Line 54 delete "signal increasing being" and replace with --signal being--.

Column 16, Line 8 delete "increase" and replace with --increases--.

Column 17, Line 67 delete "low state." and replace with --low state,--.

Column 18, Line 2 delete "FIG. 6A) At" and replace with --FIG. 6A). At--.

Column 18, Line 4 delete "proceed" and replace with --proceeds--.

Column 18, Line 10 delete "DDFF" and replace with --DDIFF--.

Column 20, Line 7 delete "POSCOMP_PK of" and replace with --POSCOMP_PK signal of--.

Column 20, Line 40 delete "POCOMP" and replace with --POSCOMP--.

Column 24, Line 24 delete "917, the" and replace with --917, if the--.

Signed and Sealed this  
Second Day of August, 2022

Katherine Kelly Vidal  
*Director of the United States Patent and Trademark Office*

CERTIFICATE OF CORRECTION (continued)
U.S. Pat. No. 11,029,176 B2

Column 24, Line 25 delete "determines. If" and replace with --determines that--.

Column 24, Line 50 delete "block 924 each" and replace with --block 924 at each--.

Column 25, Line 35 delete "944, each" and replace with --944, upon each--.

Column 26, Line 56 delete "art" and replace with --at--.

Column 28, Line 12 delete "volts)." and replace with --volts.--.

Column 29, Line 20 delete "threshold hi 1220," and replace with --THRESH HI 1220,--.

Column 29, Line 20 delete "threshold lo 1222," and replace with --THRESH LO 1222,--.

Column 29, Line 21 delete "peak hi 1230," and replace with --PEAK HI 1230,--.

Column 29, Line 21 delete "peak lo 1232." and replace with --PEAK LO 1232.--.

Column 30, Line 1 delete "SIGNAL." and replace with --signal.--.